(12) United States Patent  
Okumoto et al.

(10) Patent No.: US 8,921,867 B2  
(45) Date of Patent: Dec. 30, 2014

(54) THIN-FILM TRANSISTOR, DISPLAY PANEL, AND METHOD FOR PRODUCING A THIN-FILM TRANSISTOR

(71) Applicant: Panasonic Corporation, Osaka (JP)

(72) Inventors: Yuko Okumoto, Osaka (JP); Akihito Miyamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/130,940

(22) PCT Filed: Jun. 5, 2013

(86) PCT No.: PCT/JP2013/003528  
§ 371 (c)(1),  
(2), (4) Date: Jan. 6, 2014

(87) PCT Pub. No.: WO2013/183289  
PCT Pub. Date: Dec. 12, 2013

(65) Prior Publication Data  
US 2014/0159026 A1 Jun. 12, 2014

(30) Foreign Application Priority Data

Jun. 8, 2012 (JP) .................................. 2012-131318

(51) Int. Cl.  
*H01L 29/00* (2006.01)  
*H01L 51/00* (2006.01)  
(Continued)

(52) U.S. Cl.  
CPC .......... *H01L 51/0529* (2013.01); *H01L 29/786* (2013.01); *H01L 51/004* (2013.01);  
(Continued)

(58) Field of Classification Search  
CPC ............ H01L 29/786; H01L 29/78696; H01L 29/41733; H01L 27/3262; H01L 27/3274; H01L 27/1214; H01L 51/0529; H01L 51/0533; H01L 51/0004; H01L 51/0545; H01L 51/0541; H01L 51/0037; H01L 2251/5315  
USPC ..................... 257/40, 59, 72; 438/34, 99, 149  
See application file for complete search history.

(56) References Cited

U.S. PATENT DOCUMENTS 7,807,496 B2 10/2010 Fujimori et al.  
8,030,642 B2 * 10/2011 Yang ............................... 257/40

(Continued)

FOREIGN PATENT DOCUMENTS

JP 2004-288836 10/2004  
JP 2006-147843 6/2006

(Continued)

OTHER PUBLICATIONS

International Search Report, mailed Aug. 13, 2013, in corresponding International Application No. PCT/JP2013/003528.

*Primary Examiner* — Nikolay Yushin  
(74) *Attorney, Agent, or Firm* — Greenblum & Bernstein, P.L.C.

(57) ABSTRACT

A thin-film transistor including: a gate electrode that is located above a substrate; a gate insulating layer that faces the gate electrode; a partition that defines an opening and has higher liquid repellency than liquid repellency of the gate insulating layer, the opening having a surface of the gate insulating layer therewithin; a semiconductor layer that faces the gate electrode with the gate insulating layer interposed therebetween and is formed within the opening by an application method; a source electrode and a drain electrode that are electrically connected to the semiconductor layer; and an intermediate layer that is made of the same material as a material of the partition and is located between the gate insulating layer and the semiconductor layer, wherein the intermediate layer is discretely present above the gate insulating layer.

17 Claims, 15 Drawing Sheets

(51) Int. Cl.
*H01L 21/00* (2006.01)
*H01L 21/332* (2006.01)
*H01L 51/40* (2006.01)
*H01L 51/05* (2006.01)
*H01L 29/786* (2006.01)
*H01L 27/32* (2006.01)

(52) U.S. Cl.
CPC ........ *H01L 27/3274* (2013.01); *H01L 27/3262* (2013.01); *H01L 51/0533* (2013.01); *H01L 51/0541* (2013.01); *H01L 51/0545* (2013.01); *H01L 2251/5315* (2013.01); *H01L 51/0037* (2013.01)
USPC ............... 257/72; 257/40; 438/149; 438/134; 438/99

(56) References Cited

U.S. PATENT DOCUMENTS

| | | | |
|---|---|---|---|
| 2003/0207482 A1* | 11/2003 | Lu | 438/29 |
| 2006/0110847 A1 | 5/2006 | Fujimori et al. | |
| 2011/0294244 A1* | 12/2011 | Hattori et al. | 438/34 |
| 2013/0099215 A1 | 4/2013 | Kushida et al. | |

FOREIGN PATENT DOCUMENTS

| | | |
|---|---|---|
| JP | 2009-076791 | 4/2009 |
| JP | 2010-016280 | 1/2010 |
| JP | 2010-232480 | 10/2010 |
| WO | 2011/142267 | 11/2011 |

\* cited by examiner

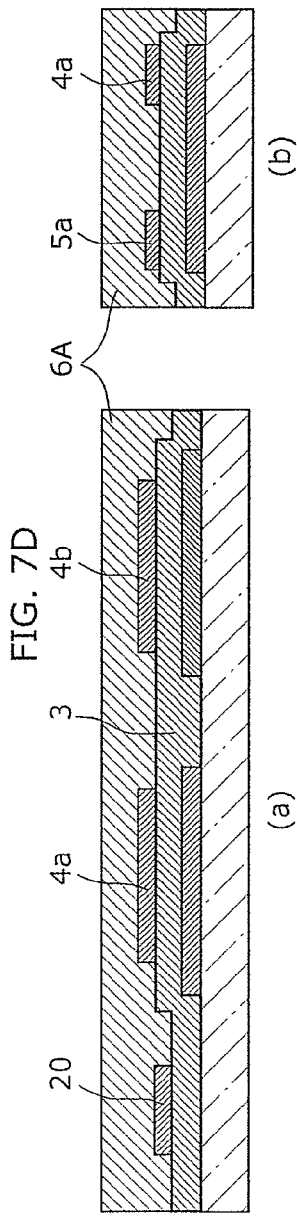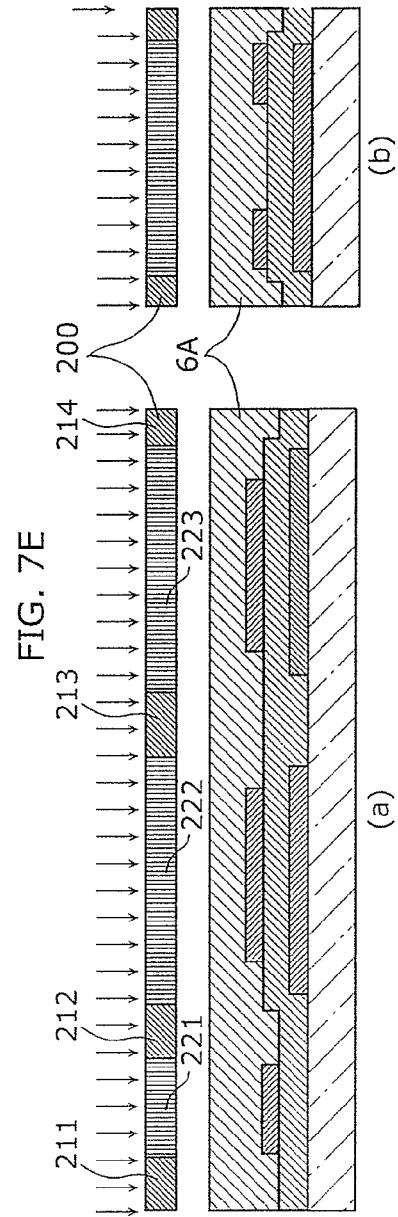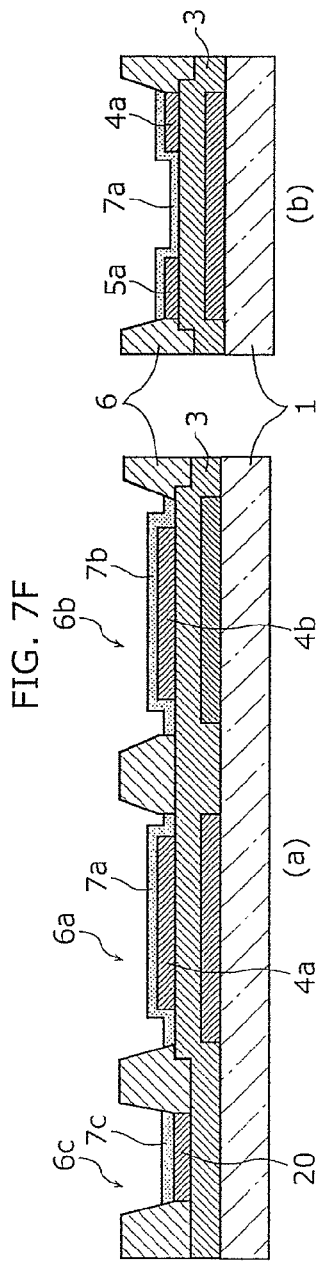

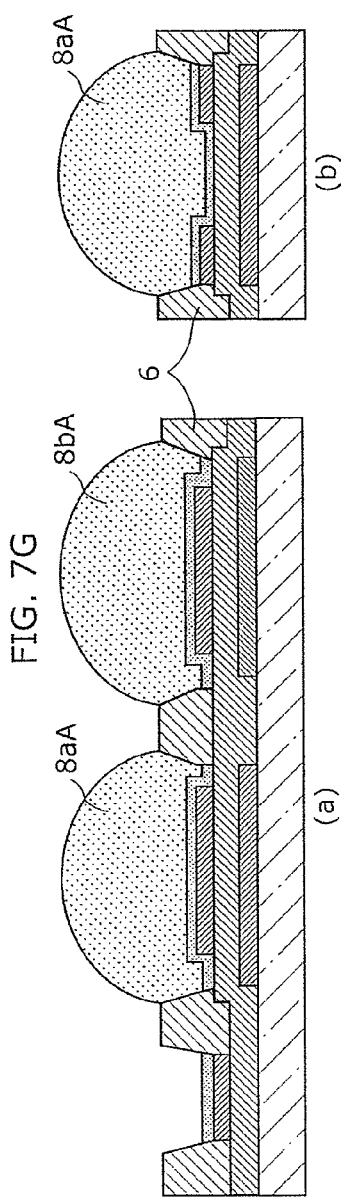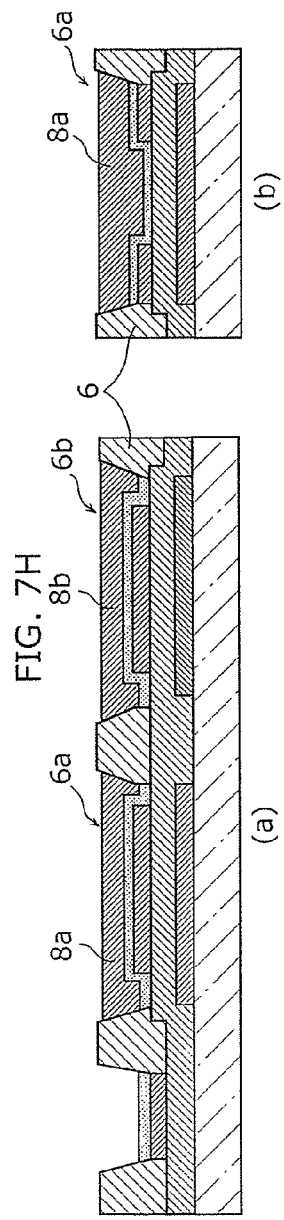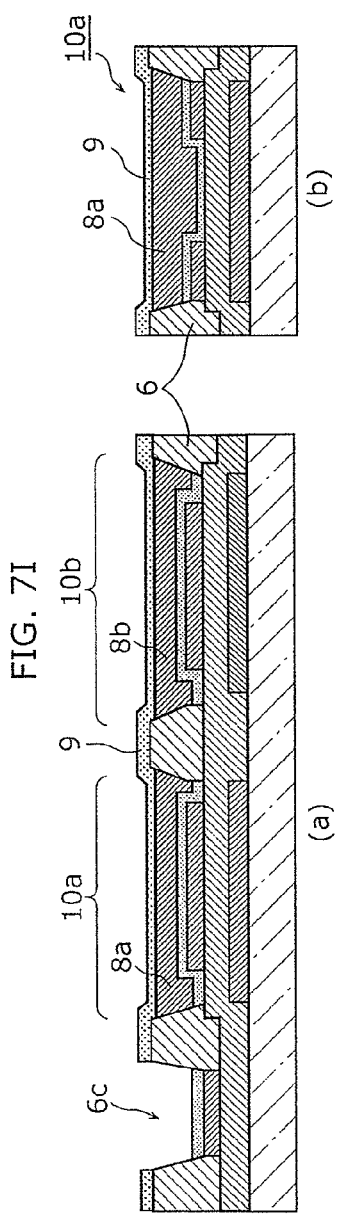

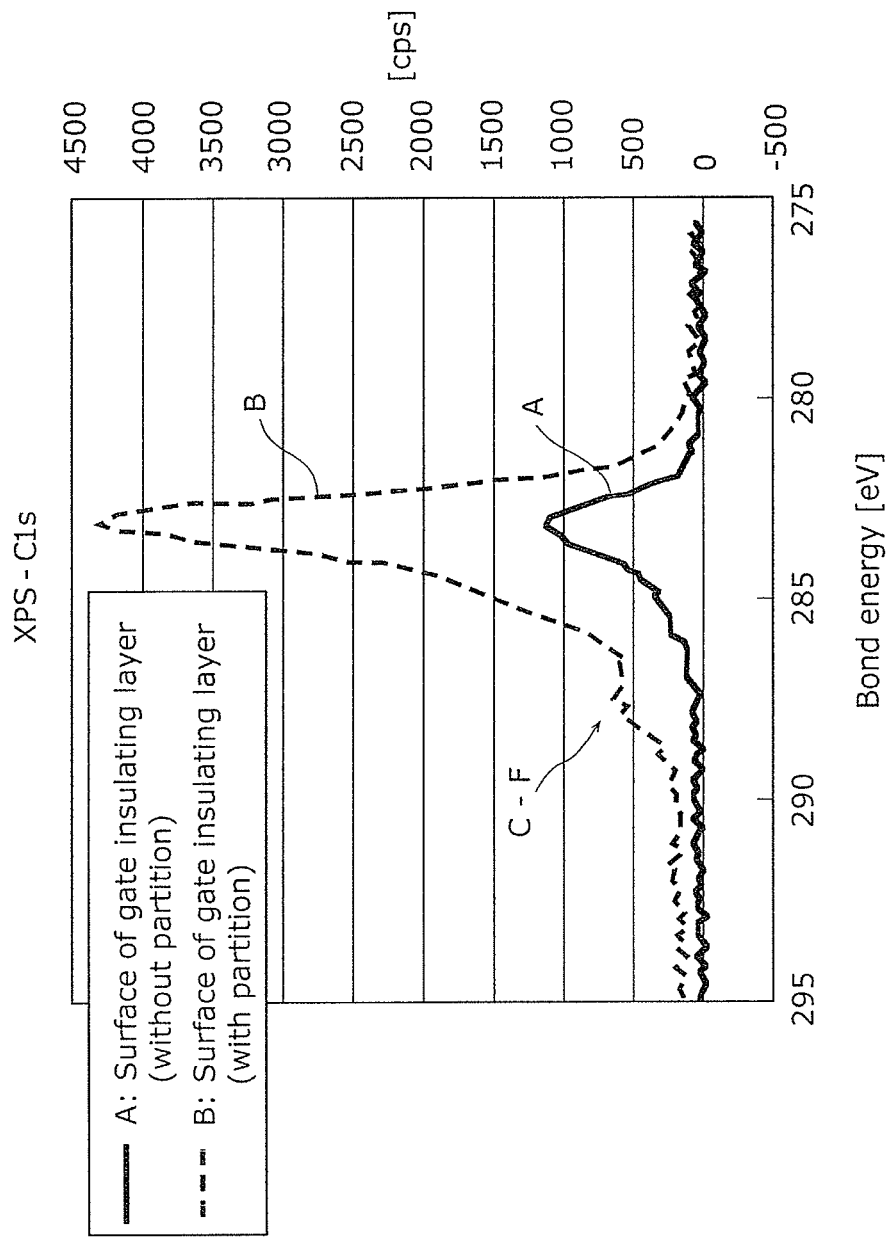

THIN-FILM TRANSISTOR, DISPLAY PANEL, AND METHOD FOR PRODUCING A THIN-FILM TRANSISTOR

TECHNICAL FIELD

One aspect of the present invention relates to a thin-film transistor, a display panel, and a method for producing a thin-film transistor, and particularly to a thin-film transistor in which a semiconductor layer is formed within an opening of a partition.

BACKGROUND ART

In active matrix driven display panels such as liquid crystal display panels and organic EL display panels, thin-film transistors (TFT) are formed in order to control the display state on a per-sub pixel basis.

Display panels generally use thin-film transistors in which silicon is used as a semiconductor layer, but in recent years, organic thin-film transistors in which an organic material is used as a semiconductor layer are being developed (see, for example, Patent Literature (PTL) 1).

FIG. 13 is a diagram showing a configuration of a conventional thin-film transistor having a semiconductor layer made of an organic material.

As shown in (a) of FIG. 13, a conventional thin-film transistor 1000 is formed by sequentially stacking, on a substrate 1001, a gate electrode 1002, a gate insulating layer 1003, a source electrode 1004 and a drain electrode 1005, and a semiconductor layer 1008. The semiconductor layer 1008 is formed on the gate insulating layer 1003 so as to fill the space between the source electrode 1004 and the drain electrode 1005 and to cover the source electrode 1004 and the drain electrode 1005.

Also, on the gate insulating layer 1003 is provided a partition 1006 for defining adjacent elements. The partition 1006 is provided with an opening 1006a, and the source electrode 1004 and the drain electrode 1005 are formed on the bottom of the opening 1006a so as to be exposed from the opening 1006a. Also, within the opening 1006a of the partition 1006, the semiconductor layer 1008 made of an organic material is formed.

The thin-film transistor 1000 thus configured is formed in each sub-pixel of, for example, an organic EL display panel, and light emission control of light-emitting elements (organic EL elements) is performed by input of a signal into the gate electrode 1002.

CITATION LIST

Patent Literature

[PTL 1] Japanese Unexamined Patent Application Publication No. 2009-76791

SUMMARY OF INVENTION

Technical Problem

However, conventional thin-film transistors are problematic in that due to a low carrier mobility and a threshold voltage shift, it is difficult to obtain good transistor characteristics.

The one aspect of the present invention has been made to solve the problem described above, and it is an object of the one aspect of the present invention to provide a thin-film transistor, a display panel and a method for producing a thin-film transistor that have more excellent transistor characteristics.

Solution to Problem

A thin-film transistor according to one aspect of the present invention includes: a gate electrode that is located above a substrate; a gate insulating layer that faces the gate electrode; a partition that defines an opening and has higher liquid repellency than liquid repellency of the gate insulating layer, the opening having a surface of the gate insulating layer therewithin; a semiconductor layer that faces the gate electrode with the gate insulating layer interposed therebetween, and is formed within the opening by an application method; a source electrode and a drain electrode that are electrically connected to the semiconductor layer; and an intermediate layer that is made of the same material as a material of the partition and is located between the gate insulating layer and the semiconductor layer, wherein the intermediate layer is discretely present above the gate insulating layer.

Advantageous Effects of Invention

According to the one aspect of the present invention, an intermediate layer is formed between the gate insulating layer and the semiconductor layer, the intermediate layer being made of the same material as the material of the partition and being discretely present on the gate insulating layer. Accordingly, the crystallinity of the semiconductor layer can be improved. With this configuration, because carrier mobility can be improved, a thin-film transistor having excellent transistor characteristics can be obtained.

Also, according to the one aspect of the present invention, the material of the intermediate layer is the same as that of the partition, and thus the intermediate layer can be formed when the partition is formed. With this configuration, it is possible to produce a thin-film transistor having excellent transistor characteristics without increasing the number of steps and the cost.

BRIEF DESCRIPTION OF DRAWINGS

FIG. 7D is composed of cross-sectional views of a partition material layer forming step of the method for producing a thin-film transistor according to Embodiment 1 of the present invention.

FIG. 7E is composed of cross-sectional views of a partition material layer exposing step of the method for producing a thin-film transistor according to Embodiment 1 of the present invention.

FIG. 7F is composed of cross-sectional views of an intermediate layer forming step of the method for producing a thin-film transistor according to Embodiment 1 of the present invention.

FIG. 7G is composed of cross-sectional views of a semiconductor ink applying step of the method for producing a thin-film transistor according to Embodiment 1 of the present invention.

FIG. 7H is composed of cross-sectional views of a semiconductor ink drying step of the method for producing a thin-film transistor according to Embodiment 1 of the present invention.

FIG. 7I is composed of cross-sectional views of a passivation film forming step of the method for producing a thin-film transistor according to Embodiment 1 of the present invention.

FIG. 8 is a diagram showing results obtained by XPS measurement of the surface of a gate insulating layer conducted before and after formation of a partition in a thin-film transistor according to Embodiment 1 of the present invention.

DESCRIPTION OF EMBODIMENTS (Background Leading to One Aspect of the Present Invention)

Figure 13:
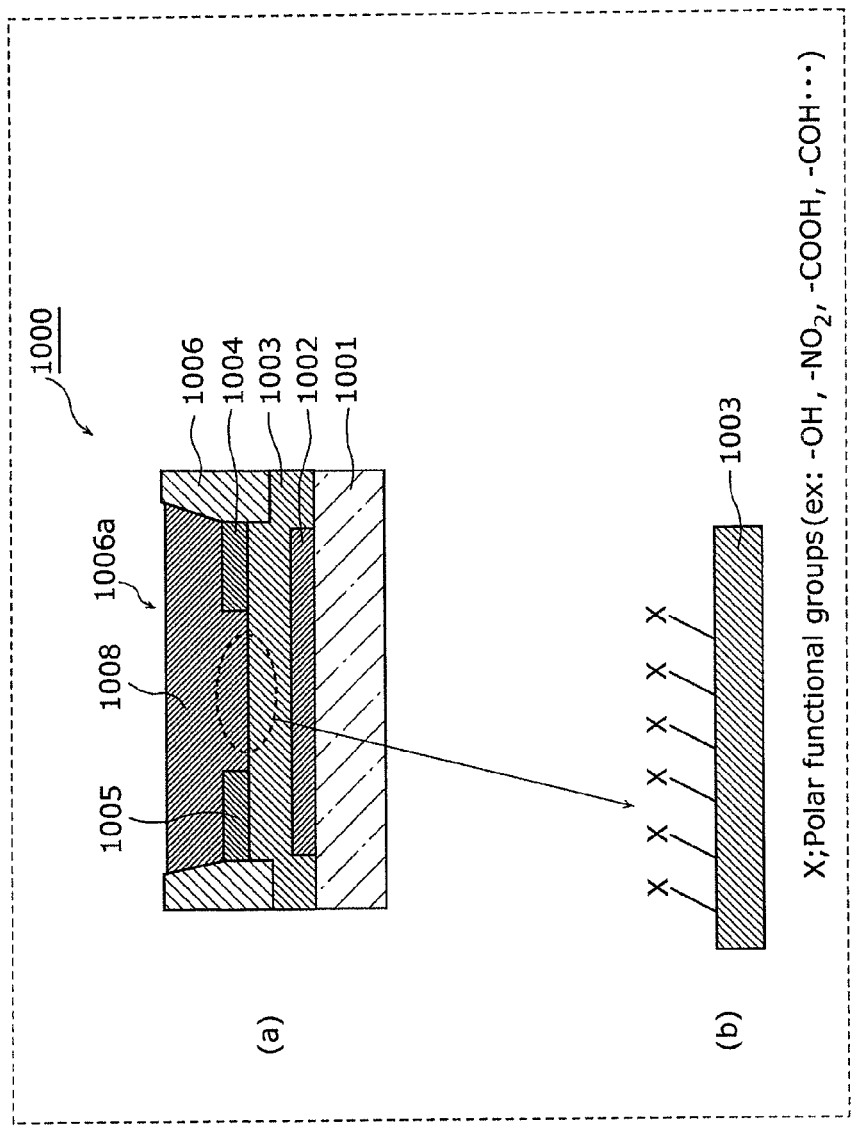
FIG. 13 is a diagram showing a configuration of a conventional thin-film transistor.

In the thin-film transistor 1000 as shown in (a) of FIG. 13, the interface between the semiconductor layer 1008 and the gate insulating layer 1003 serves as a channel portion of the thin-film transistor, which is considered to have a very significant influence on transistor characteristics such as carrier mobility and threshold voltage. That is, the semiconductor layer 1008 is significantly influenced by the surface condition of the gate insulating layer 1003, which is considered to be the cause of variations in the transistor characteristics.

For example, as shown in (b) of FIG. 13, under the semiconductor layer 1008, there is an underlying layer (the gate insulating layer 1003) having a high surface energy. This causes problems in that the crystallinity of the semiconductor layer 1008 deteriorates, reducing the carrier mobility of the semiconductor layer 1008.

Also, the underlying layer having such a high surface energy is considered to contain a large number of functional groups of high polarity. Furthermore, there are cases where process residues such as etching residues that are generated during patterning of the source electrode 1004 and the drain electrode 1005 remain on the gate insulating layer 1003 after the source electrode 1004 and the drain electrode 1005 have been formed. The polar functional groups contained in the underlying layer and the process residues remaining on the surface of the underlying layer easily attract carriers (electric charges), and act as carrier inducing sites (trap sites) in the semiconductor layer 1008. As a result, the threshold voltage of the thin-film transistor shifts.

The present invention has been made in view of the problems described above, and it is an object of the one aspect of the present invention to provide a thin-film transistor having excellent transistor characteristics without increasing the number of production steps and the cost by controlling the surface energy of the underlying layer of the semiconductor layer.

In order to achieve the above object, a thin-film transistor according to one aspect of the present invention includes: a gate electrode that is located above a substrate; a gate insulating layer that faces the gate electrode; a partition that defines an opening and has higher liquid repellency than liquid repellency of the gate insulating layer, the opening having a surface of the gate insulating layer therewithin; a semiconductor layer that faces the gate electrode with the gate insulating layer interposed therebetween, and is formed within the opening by an application method; a source electrode and a drain electrode that are electrically connected to the semiconductor layer; and an intermediate layer that is made of the same material as a material of the partition and is located between the gate insulating layer and the semiconductor layer, wherein the intermediate layer is discretely present above the gate insulating layer.

According to this aspect of the present invention, an intermediate layer made of the same material as the material of the partition having higher liquid repellency than the gate insulating layer is formed between the semiconductor layer and the gate insulating layer so as to be in contact with the semiconductor layer. With this configuration, the surface energy of the underlying layer of the semiconductor layer can be reduced as compared to the case where there is no intermediate layer between the semiconductor layer and the gate insulating layer. Accordingly, the crystallinity of the semiconductor layer can be improved, and thus the carrier mobility of the thin-film transistor can be improved. Also, because the intermediate layer is discretely present, the wetting properties of the underlying layer can be set to be in an appropriate range.

Furthermore, according to this aspect of the present invention, the intermediate layer is formed between the semiconductor layer and the gate insulating layer. With this configuration, the process residues that remain on the surface of the gate insulating layer and the exposed surface of the gate insulating layer are covered by the intermediate layer. Accordingly, the process residues and the carrier inducing sites produced by polar functional groups of the gate insulating layer can be reduced, and thus the threshold voltage shift phenomenon of the thin-film transistor can be suppressed.

Furthermore, according to this aspect of the present invention, the material of the intermediate layer is the same as the material of the partition, and thus the intermediate layer can be formed when the partition is formed by photolithography or the like. In other words, the intermediate layer can be formed at the same time the partition is formed by patterning. It is thereby possible to suppress the load in terms of the number of production steps and the cost.

Also, in the thin-film transistor according to one aspect of the present invention, the gate insulating layer on which the intermediate layer is formed may be configured to have a contact angle against water that is smaller than a contact angle against water of the partition.

According to this aspect of the present invention, the surface energy of the surface located under the semiconductor layer can be reduced, and thus the crystallinity of the semiconductor layer can be further improved.

Also, in the thin-film transistor according to one aspect of the present invention, the gate insulating layer on which the intermediate layer is formed may have a contact angle against water of 40 degrees or more and 70 degrees or less in at least a part of a region of the intermediate layer that is in contact with the semiconductor layer.

According to this aspect of the present invention, both wetting properties of application type semiconductor material (semiconductor ink) and good transistor characteristics can be achieved.

Here, if the gate insulating layer on which the intermediate layer is formed has a contact angle of less than 40 degrees, the contact angle being measured by using water as a solvent, polar functional groups (for example, hydroxyl groups, etc) that increase surface energy appear on the surface of the intermediate layer. This degrades the crystallinity of the semiconductor layer that is formed on the intermediate layer. Also, the polar functional groups easily act as carrier inducing sites in the semiconductor layer, causing a threshold voltage shift in the thin-film transistor.

If, on the other hand, the gate insulating layer on which the intermediate layer is formed has a contact angle against water of 40 degrees or more, it is possible to prevent the polar functional groups from appearing on the surface of the intermediate layer. By doing so, the degradation of the crystallinity of the semiconductor layer can be prevented, and the occurrence of a threshold voltage shift due to the carrier inducing sites can be suppressed.

Also, if the gate insulating layer on which the intermediate layer is formed has a contact angle of more than 70 degrees, the contact angle being measured by using water as a solvent, the applied semiconductor ink is repelled, and thus a good semiconductor layer cannot be formed, but by setting the contact angle of the gate insulating layer on which the intermediate layer is formed to 70 degrees or less, the desired wetting properties of the semiconductor ink can be secured, and a good semiconductor layer can be formed.

As described above, by setting the contact angle of the gate insulating layer on which the intermediate layer serving as the underlying layer of the semiconductor layer is formed to 40 degrees or more and 70 degrees or less, the crystallinity of the semiconductor layer can be improved while the wetting properties of the semiconductor ink are secured, and at the same time, the threshold voltage shift can be suppressed.

Also, in the thin-film transistor according to one aspect of the present invention, the intermediate layer may also be located between at least one of the source electrode and the drain electrode and the semiconductor layer, and the intermediate layer may be discretely present above the at least one of the source electrode and the drain electrode.

According to this aspect of the present invention, the intermediate layer having a small surface energy is present on the source electrode (the drain electrode), and thus the crystallinity of the semiconductor layer formed on the source electrode (the drain electrode) can also be improved. It is thereby possible to improve the crystallinity of the channel portion (semiconductor layer) on the gate insulating layer around the source electrode (the drain electrode) as well. Also, as a result of the intermediate layer being discretely present, the contact resistance between the source electrode or the drain electrode and the semiconductor layer can be reduced.

Also, as a result of the intermediate layer being formed on the source electrode (the drain electrode) and on the gate insulating layer, the surface energy above the source electrode (the drain electrode) and the surface energy above the gate insulating layer can be set to values close to each other. This makes it difficult for grain boundaries to occur in the semiconductor layer formed between the source electrode (the drain electrode) and the gate insulating layer, and thus the crystallinity of the semiconductor layer can be improved. In this way, by improving the crystallinity of the semiconductor layer, transistor characteristics, carrier mobility in particular, can be improved.

Also, in the thin-film transistor according to one aspect of the present invention, the intermediate layer located between the at least one of the source electrode and the drain electrode and the semiconductor layer may have a smaller thickness than a thickness of the intermediate layer located between the gate insulating layer and the semiconductor layer.

According to this aspect of the present invention, the thickness of the intermediate layer on the source electrode or the drain electrode is smaller than the thickness of the intermediate layer on the gate insulating layer, and thus the contact resistance between the source electrode or the drain electrode and the semiconductor layer can be reduced, and the carrier injection barrier can be reduced. It is thereby possible to obtain a thin-film transistor having more excellent transistor characteristics.

Also, in the thin-film transistor according to one aspect of the present invention, each of the source electrode and the drain electrode may include a first electrode layer that is in contact with the gate insulating layer, and a second electrode layer that is located above the first electrode layer and has a lower injection barrier to the semiconductor layer than the first electrode layer, and a distance from a surface of the gate insulating layer to a surface of the semiconductor layer may be greater than a thickness of the first electrode layer.

According to this aspect of the present invention, the contact region where the first electrode layer and the semiconductor layer are in contact can be reduced by an amount corresponding to the thickness of the intermediate layer, and at the same time, the contact region where the second electrode layer and the semiconductor layer are in contact can be increased. This suppresses the reduction of carrier injection efficiency and increases the carrier injection efficiency, and thus a thin-film transistor having excellent transistor characteristics can be achieved.

Also, in the thin-film transistor according to one aspect of the present invention, each of the source electrode and the drain electrode may include a first electrode layer that is in contact with the gate insulating layer, and a second electrode layer that is located above the first electrode layer and has a lower injection barrier to the semiconductor layer than the first electrode layer, and the intermediate layer may have a greater thickness than the thickness of the first electrode layer.

According to this aspect of the present invention, due to the thickness of the intermediate layer, the contact region where the first electrode layer and the semiconductor layer are in contact does not exist, and thus the second electrode layer is in contact with the semiconductor layer from the bottom surface to the upper portion. Accordingly, the reduction of the carrier injection efficiency can be suppressed, and at the same time, the carrier injection efficiency can be increased, and thus a thin-film transistor having excellent transistor characteristics can be achieved.

Also, a display panel according to one aspect of the present invention includes any one of the thin-film transistors described above.

As a result of the display panel including a thin-film transistor element according to one aspect of the present invention, a high-quality display panel as a whole can be obtained.

Also, the display panel according to one aspect of the present invention may include a plurality of the thin-film transistors formed in each of a plurality of pixels arranged in a matrix; and a display element, wherein one of the thin-film transistors may be a driving transistor that drives the display element, another of the thin-film transistors may be a switching transistor that selectively switches driving of the display element, and the gate insulating layer on which the intermediate layer is formed in the driving transistor may have a contact angle against water greater than a contact angle against water of the gate insulating layer on which the intermediate layer is formed in the switching transistor.

With this configuration, the crystallinity of the semiconductor layer of the driving transistor can be increased as compared to the crystallinity of the semiconductor layer of the switching transistor. As a result, the carrier mobility of the driving transistor can be made higher than the carrier mobility of the switching transistor, and thus the on-characteristics of the driving transistor can be improved more than the on-characteristics of the switching transistor.

A method for producing a thin-film transistor according to one aspect of the present invention includes: forming a gate electrode above a substrate; forming a gate insulating layer that faces the gate electrode; forming a source electrode and a drain electrode above the gate insulating layer; forming a partition material layer above the gate insulating layer by applying a partition material having higher liquid repellency than liquid repellency of the gate insulating layer to the gate insulating layer; discretely forming an intermediate layer above the gate insulating layer and forming a partition having an opening by patterning the partition material layer, the opening having at least a part of the source electrode and the drain electrode therewithin, the intermediate layer being made of the same material as a material of the partition material layer; and forming a semiconductor layer above the intermediate layer within the opening by an application method.

According to this aspect of the present invention, an intermediate layer made of the same material as the material of the partition having higher liquid repellency than the gate insulating layer is formed between the semiconductor layer and the gate insulating layer so as to be in contact with the semiconductor layer. With this configuration, the surface energy of the underlying layer of the semiconductor layer can be reduced as compared to the case where there is no intermediate layer between the semiconductor layer and the gate insulating layer, and thus a semiconductor layer having excellent crystallinity can be formed. It is thereby possible to obtain a thin-film transistor having excellent transistor characteristics, excellent carrier mobility in particular. Also, because the intermediate layer is discretely present, the wetting properties of the underlying layer can be set to be in an appropriate range.

Furthermore, according to this aspect of the present invention, the intermediate layer is formed between the semiconductor layer and the gate insulating layer. With this configuration, the process residues that remain on the surface of the gate insulating layer and the exposed surface of the gate insulating layer can be covered by the intermediate layer. Accordingly, because the process residues and the carrier inducing sites produced by polar functional groups of the gate insulating layer can be reduced, it is possible to obtain a thin-film transistor in which the threshold voltage shift is suppressed.

Furthermore, according to this aspect of the present invention, the material of the intermediate layer is the same as the material of the partition, and thus the intermediate layer can be formed when the partition is formed by photolithography or the like. In other words, the intermediate layer can be formed at the same time the partition is formed by patterning. With this configuration, it is possible to obtain a thin-film transistor having excellent transistor characteristics without increasing the number of production steps and the cost.

Also, in the method for producing a thin-film transistor according to one aspect of the present invention, in the forming of the intermediate layer, the intermediate layer may be formed to allow the gate insulating layer on which the intermediate layer is formed to have a contact angle against water smaller than a contact angle against water of the partition.

According to this aspect of the present invention, the surface energy of the surface located under the semiconductor layer can be reduced, and thus the crystallinity of the semiconductor layer can be further improved. It is thereby possible to obtain a thin-film transistor having excellent transistor characteristics.

Also, in the method for producing a thin-film transistor according to one aspect of the present invention, in the forming of the intermediate layer, the intermediate layer may be formed to allow the gate insulating layer on which the intermediate layer is formed to have a contact angle against water of 40 degrees or more and 70 degrees or less in at least a part of a region of the intermediate layer that is in contact with the semiconductor layer.

According to this aspect of the present invention, both wetting properties of application type semiconductor material (semiconductor ink) and good transistor characteristics can be achieved.

Also, in the method for producing a thin-film transistor according to one aspect of the present invention, in the forming of the intermediate layer, the intermediate layer may be discretely formed above at least one of the source electrode and the drain electrode.

According to this aspect of the present invention, the intermediate layer having a small surface energy is present on the source electrode (the drain electrode), and thus the crystallinity of the semiconductor layer formed on the source electrode (the drain electrode) can also be improved. It is thereby possible to improve the crystallinity of the channel portion (semiconductor layer) on the gate insulating layer around the source electrode (the drain electrode).

Also, the intermediate layer is formed on the source electrode (the drain electrode) and on the gate insulating layer, whereby the surface energy above the source electrode (the drain electrode) and the surface energy above the gate insulating layer can be set to values close to each other. This makes it difficult for grain boundaries to occur in the semiconductor layer formed between the source electrode (the drain electrode) and the gate insulating layer, and thus the crystallinity of the semiconductor layer can be improved.

As described above, by improving the crystallinity of the semiconductor layer, transistor characteristics, carrier mobility in particular, can be improved. Accordingly, a thin-film transistor having excellent transistor characteristics can be obtained.

Also, in the method for producing a thin-film transistor according to one aspect of the present invention, the forming of the intermediate layer may include exposing the partition material layer to exposure light via a mask, and in the exposing of the partition material layer, a mask may be placed that has a higher transmittance of the exposure light above the partition material layer located on the gate insulating layer than a transmittance of the exposure light above the partition material layer located on the source electrode or the drain electrode.

According to this aspect of the present invention, the thickness of the intermediate layer on the source electrode or the drain electrode can be made smaller than the thickness of the immediate layer on the gate insulating layer. Accordingly, the carrier injection barrier between the source electrode or the drain electrode and the semiconductor layer can be reduced, and thus a thin-film transistor having more excellent transistor characteristics can be obtained.

Also, in the method for producing a thin-film transistor according to one aspect of the present invention, in the forming of the intermediate layer, after the intermediate layer has been formed above the gate insulating layer and above at least one of the source electrode and the drain electrode, a thickness of the intermediate layer formed above the at least one of the source electrode and the drain electrode may be reduced by irradiating the intermediate layer formed above the at least one of the source electrode and the drain electrode with laser light.

According to this aspect of the present invention, the thickness of the intermediate layer on the source electrode or the drain electrode can be made smaller than the thickness of the intermediate layer on the gate insulating layer. Accordingly, the carrier injection barrier between the source electrode or the drain electrode and the semiconductor layer can be reduced, and thus a thin-film transistor having more excellent transistor characteristics can be obtained.

Also, in the method for producing a thin-film transistor according to one aspect of the present invention, in the forming of the source electrode and the drain electrode, the source electrode and the drain electrode may be formed by forming a first electrode layer that is in contact with the gate insulating layer, and a second electrode layer that is located above the first electrode layer and has a lower injection barrier to the semiconductor layer than the first electrode layer, and in the forming of the semiconductor layer, the semiconductor layer may be formed to make a distance from a surface of the gate insulating layer to a surface of the semiconductor layer greater than a thickness of the first electrode layer.

According to this aspect of the present invention, the contact region where the first electrode layer and the semiconductor layer are in contact can be reduced by an amount corresponding to the thickness of the intermediate layer, and at the same time, the contact region where the second electrode layer and the semiconductor layer are in contact can be increased. This suppresses the reduction of carrier injection efficiency and increases the carrier injection efficiency, and thus a thin-film transistor having excellent transistor characteristics can be obtained.

Also, in the method for producing a thin-film transistor according to one aspect of the present invention, in the forming of the source electrode and the drain electrode, the source electrode and the drain electrode may be formed by forming a first electrode layer that is in contact with the gate insulating layer, and a second electrode layer that is located above the first electrode layer and has a lower injection barrier to the semiconductor layer than the first electrode layer, and in the forming of the intermediate layer, the intermediate layer may be formed to make a thickness of the intermediate layer greater than a thickness of the first electrode layer.

According to this aspect of the present invention, due to the thickness of the intermediate layer, the contact region where the first electrode layer and the semiconductor layer are in contact does not exist, and thus the second electrode layer is in contact with the semiconductor layer from the bottom surface to the upper portion. Accordingly, the reduction of the carrier injection efficiency can be suppressed, and at the same time, the carrier injection efficiency can be increased, and thus a thin-film transistor having excellent transistor characteristics can be achieved.

[Embodiments]

Hereinafter, embodiments of the present invention will be described with reference to the drawings. Each of the exemplary embodiments described below shows a specific example of the present invention. Accordingly, the numerical values, shapes, materials, structural elements, the arrangement and connection of the structural elements, steps, the processing order of the steps, etc. shown in the following exemplary embodiments are mere examples, and therefore do not limit the scope of the claims of the present invention. Therefore, among the structural elements in the following embodiments, structural elements not recited in any one of the independent claims that indicate the broadest concepts of the invention are not necessarily required to achieve the object of the present invention, but are described as structural elements that constitute preferable embodiments.

In the diagrams, the same reference numerals are given to substantially the same structural members. Also, the diagrams are schematic diagrams, and thus they are not drawn exactly on the same scale. In this specification, the term "above" does not simply refer to the upward direction (vertically upward) in absolute space, but is used as a term defined by a relative positional relationship based on the stacking order in a stack configuration. Also, the term "above" encompasses not only the case where two structural elements are disposed spaced apart from each other with another structural element interposed between the two structural elements, but also the case where two structural elements are disposed closely adhering to each other and making contact with each other.

[Embodiment 1]

Hereinafter, a thin-film transistor, a display panel, and a method for producing a thin-film transistor according to Embodiment 1 of the present invention will be described.

(Configuration of Organic EL Display Apparatus 100)

Figure 1:
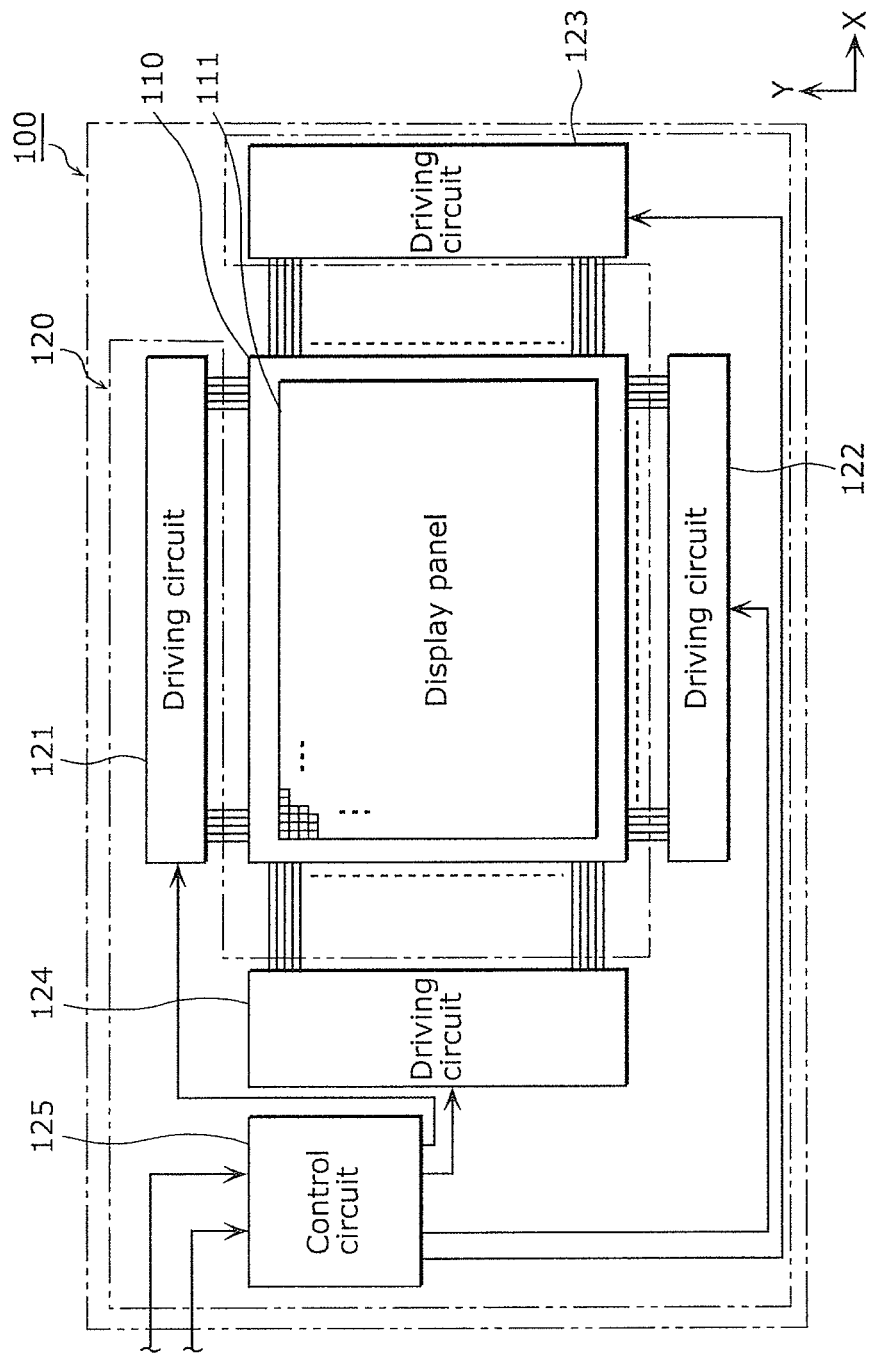
FIG. 1 is a diagram showing a schematic configuration of an organic EL display apparatus according to Embodiment 1 of the present invention.

First, as an example of a display apparatus according to Embodiment 1 of the present invention, a configuration of an organic EL display apparatus 100 will be described with reference to FIG. 1. FIG. 1 is a diagram showing a schematic configuration of an organic EL display apparatus according to Embodiment 1 of the present invention.

As shown in FIG. 1, the organic EL display apparatus 100 includes an organic EL display panel 110, and a driving control circuit portion 120 connected to the organic EL display panel 110.

The organic EL display panel 110 is a display panel utilizing an electroluminescent phenomenon of an organic material, and includes a pixel portion (display portion) 111 in which a plurality of sub pixels PX are arranged, for example, in a matrix. In each of the plurality of sub pixels, an organic EL element (not shown) is formed as a light-emitting element. The plurality of sub pixels can be configured by using, for example, red light-emitting pixels, green light-emitting pixels, and blue light-emitting pixels. It is also possible to form organic EL elements that emit red light, organic EL elements that emit green light, and organic EL elements that emit blue light so as to correspond to light-emitting pixels of respective colors.

The driving control circuit portion 120 is provided at the periphery of the organic EL display panel. The driving control circuit portion 120 includes, for example, four driving circuits 121 to 124, and a control circuit 125. In the organic EL display apparatus 100 according to the present embodiment, the arrangement of the driving control circuit portion 120 in the organic EL display panel 110 is not limited to that shown in FIG. 1.

(Configuration of Organic EL Display Panel 110)

Figure 2:
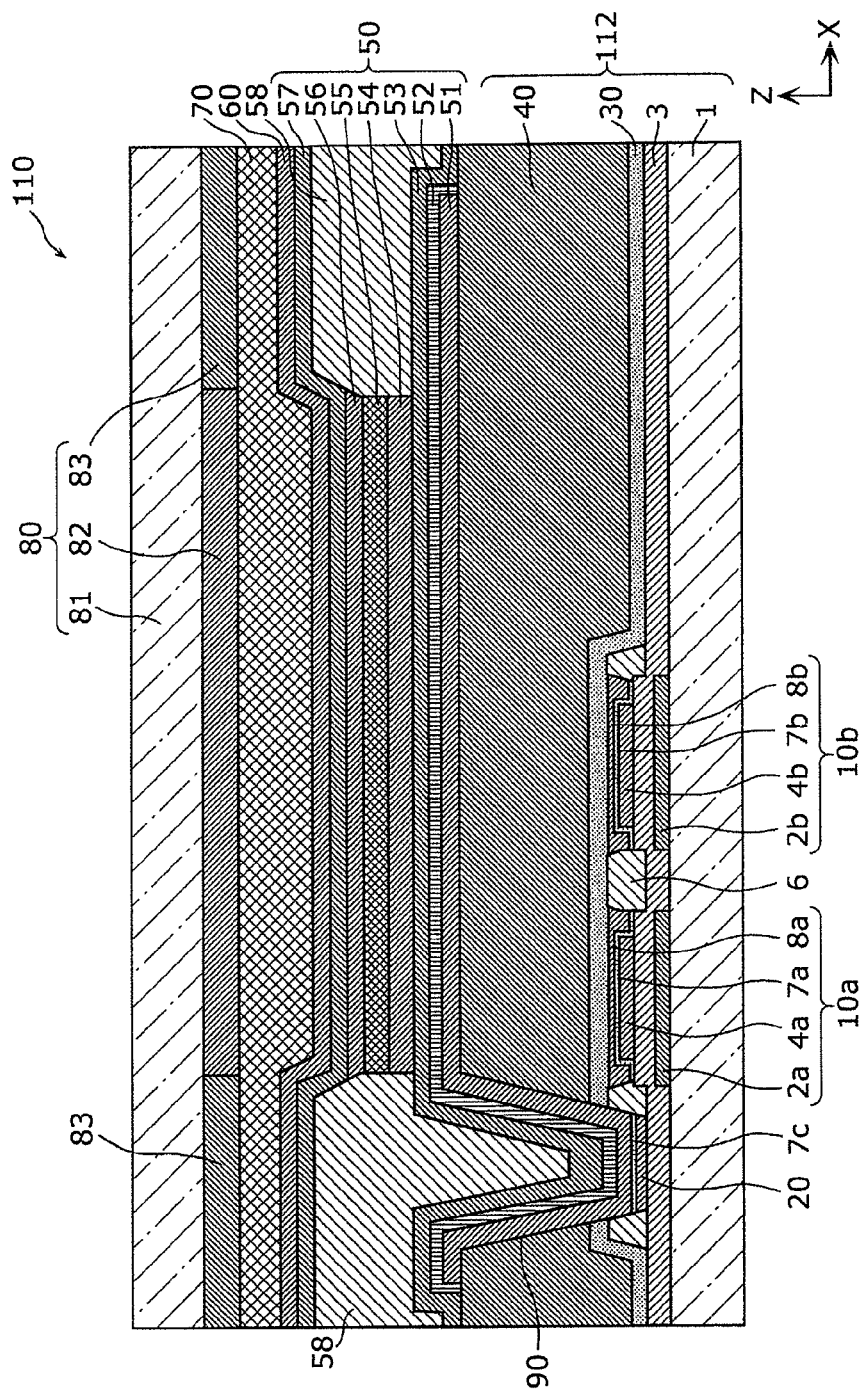
FIG. 2 is a diagram showing a configuration of an organic EL display panel according to Embodiment 1 of the present invention.

A configuration of the organic EL display panel 110 will be described next with reference to FIG. 2. FIG. 2 is a diagram showing a configuration of the organic EL display panel according to Embodiment 1 of the present invention.

As shown in FIG. 2, the organic EL display panel 110 includes a TFT (thin-film transistor) substrate 112. The TFT substrate 112 includes a first thin-film transistor 10a, a second thin-film transistor 10b, and connection wiring 20. Also, the organic EL display panel 110 includes a passivation film 30 formed so as to cover a semiconductor layer 8a of the first thin-film transistor 10a and a semiconductor layer 8b of the second thin-film transistor 10b, a planarization film 40 formed on the passivation film 30, an organic EL element 50 formed on the planarization film 40, a sealing layer 60 formed so as to cover the organic EL element 50, an adhesive layer 70 formed on the sealing layer 60, and a CF substrate (color filter substrate) 80 provided on the adhesive layer 70. Hereinafter, the structural members of the organic EL display panel 110 will be described in detail.

The first thin-film transistor 10a is a driving transistor for driving the organic EL element 50. The light-emitting state of the organic EL element 50 is controlled by the first thin-film transistor 10a. The first thin-film transistor 10a according to the present embodiment is a p-channel transistor, and thus a drain electrode 5a of the first thin-film transistor 10a is electrically connected to an anode 51 of the organic EL element 50.

The second thin-film transistor 10b is a switching transistor that selectively switches driving (light emission) of the organic EL element 50 based on a gate signal. The second thin-film transistor 10b according to the present embodiment is also a p-channel transistor.

The connection wiring 20 is formed so as to extend from a source electrode 4a or the drain electrode 5a of the first thin-film transistor 10a, and is electrically connected to either one of the source electrode 4a and the drain electrode 5a. In the present embodiment, because the first thin-film transistor 10a is a p-channel transistor, the connection wiring 20 is formed by extending the drain electrode 5a. Also, the connection wiring 20 is formed within an opening 6c of the partition 6. A contact hole 90 is formed on the connection wiring 20, and the contact hole 90 communicates with the opening 6c of the partition 6.

The passivation film 30 can be formed by using, for example, a water-soluble resin such as polyvinyl alcohol (PVA), fluorocarbon resin, or the like. Due to the contact hole 90, the passivation film 30 is not formed above the connection wiring 20.

The planarization film 40 is a thick interlayer insulating layer formed to planarize the surfaces of the first thin-film transistor 10a, the second thin-film transistor 10b, and the like. The planarization film 40 is formed above the entire surface of a substrate 1 so as to cover the first thin-film transistor 10a, the second thin-film transistor 10b, and the like. The planarization film 40 can be formed by using, for example, an organic compound such as polyimide, polyamide or an acrylic resin material. Due to the contact hole 90, the planarization film 40 is not formed above the connection wiring 20.

The organic EL element 50 is formed one per sub pixel, each including an anode 51, a transparent conductive film 52, a hole injection layer 53, a hole transport layer 54, an organic light-emitting layer 55, an electron transport layer 56, and a cathode 57. These layers are formed in sequence on the planarization film 40. The anode 51, the transparent conductive film 52, and the hole injection layer 53 are also formed so as to extend along the side surface of the planarization film 40, the side surface facing the contact hole 90.

The anode 51 is formed on the planarization film 40. In the contact hole 90, the anode 51 is electrically connected to the connection wiring 20 via an intermediate layer 7c. Electric current from the first thin-film transistor 10a, which is a driving transistor, flows into the anode 51. To be specific, electric current corresponding to data voltage supplied through source wiring (data lines) is supplied from the drain electrode 5a of the first thin-film transistor 10a to the anode 51.

The anode 51 is made of a metal material including silver (Ag) or aluminum (Al). The organic EL display panel 110 according to the present embodiment is a top-emission display panel, and thus the anode 51 is preferably a reflective electrode having a highly reflective surface.

The transparent conductive film 52 can be formed by using, for example, a transparent metal oxide such as indium tin oxide (ITO) or indium zinc oxide (IZO). The transparent conductive film 52 and the anode 51 together constitute a bottom electrode.

The hole injection layer 53 is a layer made of, for example, an oxide of silver (Ag), molybdenum (Mo), chromium (Cr), vanadium (V), tungsten (W), nickel (Ni), or iridium (Ir), or a conductive polymer material such as PEDOT (a mixture of polythiophene and polystyrene sulfonic acid). In the present embodiment, the hole injection layer 53 is assumed to be made of a metal oxide. Metal oxides have a higher work function than conductive polymers, and thus when the hole injection layer 53 is made of a metal oxide, holes can be injected into the organic light-emitting layer 55 consistently or by assisting generation of holes, as compared to when the hole injection layer 53 is made of a conductive polymer material such as PEDOT.

Furthermore, when the hole injection layer 53 is made of an oxide of a transition metal, the hole injection layer 53 can assume a plurality of energy levels in order to assume a plurality of oxidation numbers. This facilitates hole injection, and thus the driving voltage can be reduced. Particularly when the hole injection layer 53 is made of tungsten oxide ($WO_x$), holes can be injected more consistently, and generation of holes can be further assisted.

The hole transport layer 54 can be formed by using a polymer compound that does not have a hydrophilic group. For example, it is possible to use a polymer compound, such as polyfluorene or a derivative thereof, or polyarylamine or a derivative thereof, that does not have a hydrophilic group.

The organic light-emitting layer 55 has a light-emitting function by being brought into an excited state in response to recombination of holes and electrons that have been injected. As the material of the organic light-emitting layer 55, it is possible to use a light-emitting organic material that can be formed into a film by using a wet printing method.

For the organic light-emitting layer 55, it is possible to use, for example, a fluorescent material such as an oxinoid compound, a perylene compound, a coumarin compound, an azacoumarin compound, an oxazole compound, an oxadiazole compound, a perinone compound, a pyrrolopyrrole compound, a naphthalene compound, an anthracene compound, a fluorene compound, a fluoranthene compound, a tetracene compound, a pyrene compound, a coronene compound, a quinolone compound, an azaquinolone compound, a pyrazoline derivative, a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylenepyran compound, a dicyanomethylenethiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, an anthracene compound, a cyanin compound, an acridine compound, a metal complex of a 8-hydroxyquinolin compound, a metal complex of a 2-bipyridine compound, a complex of a Schiff base and a group III metal, an oxine metal complex, and a rare-earth complex.

The electron transport layer 56 has a function of transporting electrons injected from the cathode 57 to the organic light-emitting layer 55. The electron transport layer 56 can be made of, for example, an oxadiazole derivative (OXD), a triazole derivative (TAZ), a phenanthroline derivative (BCP, Bphen), or the like.

The cathode (top electrode) 57 is a counter electrode formed to face the anode 51. The cathode 57 is formed so as to cover the electron transport layer 56 and an exposed surface of a bank 58, and serves as a common electrode that is common to all of the sub pixels. The cathode 57 can be formed by using, for example, a transparent metal oxide such as ITO or IZO. In the case where the organic EL display panel 110 is a top-emission display panel as in the present embodiment, the cathode 57 needs to be made of a light-transmitting material, and thus preferably is a transparent electrode. The cathode 57 preferably has a light transmittance of 80% or more.

Other than the above structure, the cathode 57 may have a structure in which, for example, a layer made of an alkali metal, a layer made of an alkaline earth metal or a layer made of a material containing a halide of an alkali metal or an alkaline earth metal, or any of the above layers containing silver are stacked in this order. In this case, the silver-containing layer may be made of silver alone, or may be made of a silver alloy. Also, in order to improve light extraction efficiency of the organic EL display panel 110, a (for example, transparent) refractive index adjusting layer having a high light transmittance may be further provided on the silver-containing layer.

The bank 58 is formed so as to surround an area corresponding to a sub pixel (light-emitting portion), and has an opening for defining and isolating the organic light-emitting layer 55 as a sub pixel. The bank 58 according to the present embodiment is formed on the hole injection layer 53, and surrounds the hole transport layer 54, the organic light-emitting layer 55, and the electron transport layer 56. That is, the hole transport layer 54, the organic light-emitting layer 55, and the electron transport layer 56 are stacked in the opening of the bank 58.

The bank 58 has insulation properties, and can be formed by using an organic material such as a resin. Examples of the material that can be used for the bank 58 include acrylic resin, polyimide resin, novolac phenol resin, and the like. For example, the bank 58 can be formed by using a photosensitive resin, and the opening can be formed by partially exposing and developing the photosensitive resin.

Also, the bank 58 may have organic solvent resistance. Furthermore, because an etching process, a baking process, and the like may be performed during production of the organic EL display panel 110, the bank 58 is preferably made of a material that is highly resistant to deformation and alteration so that it does not excessively deform or alter due through these processes.

Also, in order to impart water repellency to the surface of the bank 58, the surface of the bank 58 may be subjected to a fluorination treatment. When the bank 58 is formed by using a lyophilic material, the difference in lyophilicity/liquid repellency between the surface of the bank 58 and the surface of the organic light-emitting layer 55 is small, and therefore it is difficult to selectively retain ink for forming the organic light-emitting layer 55 and containing an organic material in the opening defined by the bank 58. Accordingly, it is preferable to perform a fluorination treatment or the like on the surface of the bank 58 so as to impart liquid repellency (water repellency) to the surface of the bank 58.

Furthermore, the structure of the bank 58 is not limited to a single layer structure, and may be a multilayer structure having two layers or more. In this case, the above-listed materials may be used in combination for each layer, or a combination of an inorganic material and an organic material may be used for each layer.

The sealing layer 60 is stacked on the cathode 57. The sealing layer 60 has a function of preventing organic layers such as the organic light-emitting layer 55 from being exposed to moisture and air. For the sealing layer 60, for example, an inorganic material can be used such as SiN (silicon nitride) or SiON (silicon oxynitride). A sealing resin layer made of a resin material such as acrylic resin or silicone resin may be further formed on the sealing layer 60 made of SiN, SiON, or the like. In the case where the organic EL display panel 110 is a top-emission display panel as in the present embodiment, the sealing layer 60 needs to be made of a light-transmitting material.

The adhesive layer 70 has a function of bonding the substrate on which layers up to the sealing layer 60 have been formed to the CF substrate 80. The adhesive layer 70 fills the space between the sealing layer 60 and the CF substrate 80 and bonds the sealing layer 60 and the CF substrate 80. As the material of the adhesive layer 70, for example, a resin such as acrylic resin or epoxy resin can be used.

The CF substrate 80 includes a transparent substrate 81, a color filter 82 formed on a lower primary surface in the Z-axis direction of the transparent substrate 81, and a black matrix 83. As the color filter 82, for example, a red color filter, a green color filter, and a blue color filter can be used to respectively correspond to red light-emitting pixels, green light-emitting pixels and blue light-emitting pixels.

(Configuration of Thin-Film Transistors and Connection Wiring)

Figure 3:
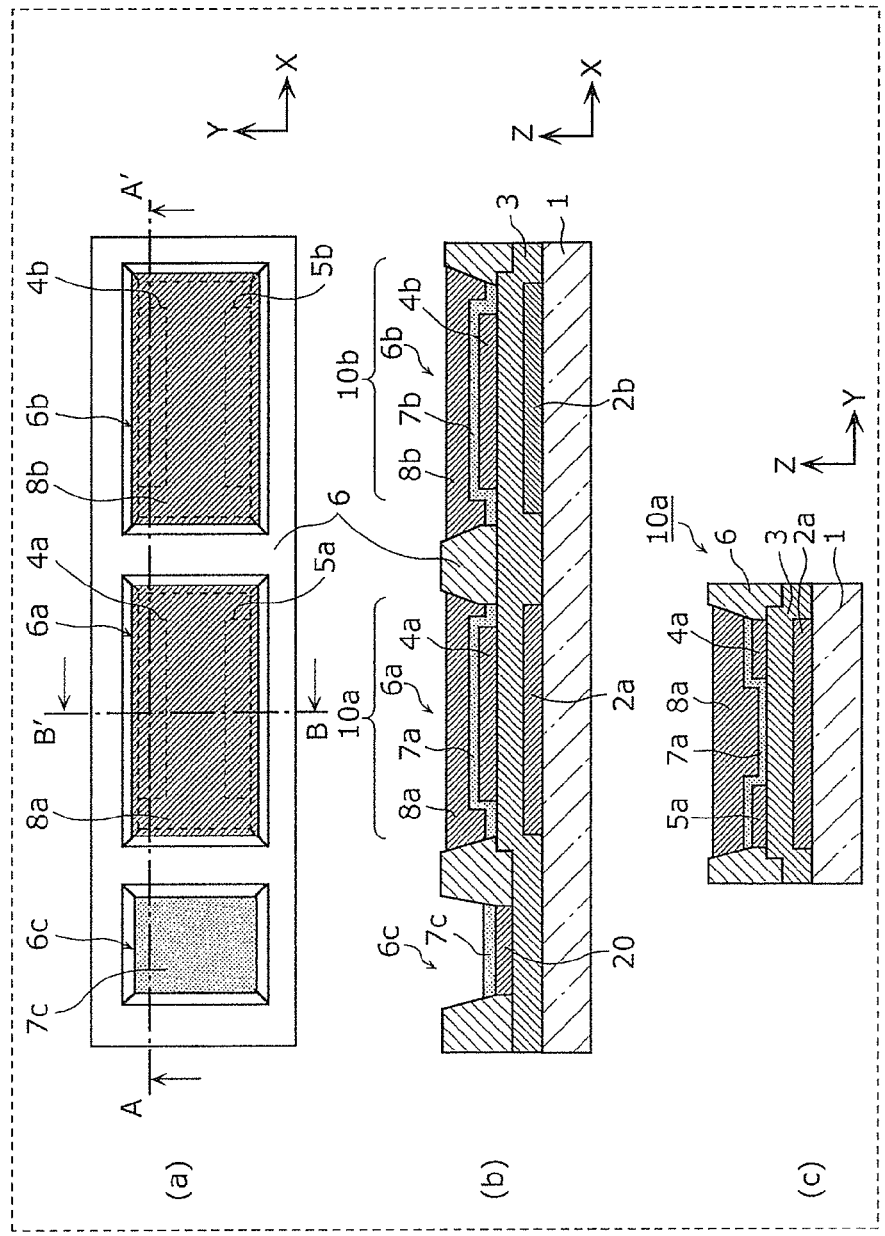
FIG. 3, (a) is a plan view showing a configuration of thin-film transistors and connection wiring according to Embodiment 1 of the present invention, (b) is a cross-sectional view taken along the line A-A' in (a) of FIG. 3, and (c) is a cross-sectional view taken along the line B-B' in (a) of FIG. 3.

Next, a configuration of the first thin-film transistor 10a, the second thin-film transistor 10b and the connection wiring 20 will be described with reference to FIG. 3. FIG. 3 shows a configuration of the thin-film transistors and connection wiring according to Embodiment 1 of the present invention, with (a) being a plan view (X-Y plan view), (b) being a cross-sectional view (X-Z cross-sectional view) taken along the line A-A' of (a) of FIG. 3, and (c) being a cross-sectional view (Y-Z cross-sectional view) taken along the line B-B' of (a) of FIG. 3.

As shown in (a) to (c) of FIG. 3, the first thin-film transistor 10a includes the substrate 1, a gate electrode (first gate electrode) 2a, the gate insulating layer 3, the source electrode (first source electrode) 4a, the drain electrode (first drain electrode) 5a, the partition 6, an intermediate layer (first intermediate layer) 7a, and the semiconductor layer (first semiconductor layer) 8a.

The second thin-film transistor 10b includes the substrate 1, a gate electrode (second gate electrode) 2b, the gate insulating layer 3, a source electrode (second source electrode) 4b, a drain electrode (second drain electrode) 5b, the partition 6, an intermediate layer (second intermediate layer) 7b, and the semiconductor layer (second semiconductor layer) 8b.

In the first thin-film transistor 10a and the second thin-film transistor 10b, the semiconductor layers 8a and 8b serving as a channel layer are respectively formed in openings 6a and 6b of the partition 6. Specifically, the first thin-film transistor 10a and the second thin-film transistor 10b according to the present embodiment are organic thin-film transistors in which the semiconductor layers 8a and 8b are made of an organic semiconductor material. Also, the first thin-film transistor 10a and the second thin-film transistor 10b are bottom gate thin-film transistors.

Hereinafter, the structural elements of the first thin-film transistor 10a and the second thin-film transistor 10b will be described in detail.

(Substrate 1)

As the substrate 1, for example, a glass substrate, a quartz substrate, a silicon substrate, a metal substrate made of molybdenum sulfide, copper, zinc, aluminum, stainless steel, magnesium, iron, nickel, gold, silver or the like, a semiconductor substrate such as a gallium arsenide substrate, a plastic substrate, or the like can be used.

In this case, as the plastic substrate, either a thermoplastic or thermosetting resin may be used. Also, as the plastic substrate, a flexible substrate having flexibility such as a plastic film may be used. Examples of the material that can be used for the plastic substrate include: polyolefins such as polyethylene, polypropylene, an ethylene-propylene copolymer, and an ethylene-vinyl acetate copolymer (EVA); cyclic polyolefins; modified polyolefins; poly(vinyl chloride); poly(vinylidene chloride); polystyrene; polyamide; polyimide (PI); polyamide imide; polycarbonate; poly-(4-methylbenzene-1); an ionomer; acrylic resin; polymethylmethacrylate; an acrylic styrene copolymer (AS resin); a butadiene-styrene copolymer; an ethylene vinyl alcohol copolymer (EVOH); polyesters such as polyethylene terephthalate (PET), polybutylene terephthalate, polyethylene naphthalate (PEN), and poiycyclohexane terephthalate (PCT); poiyether; polyetherkeotne; polyethersulfone (PES); polyetherimide; polyacetal; polyphenylene oxide; modified polyphenylene oxide; polyarylate; aromatic polyester (liquid crystal polymer); fluorocarbon resins such as polytetrafluoroethylene, and poly(vinylidene fluoride); various types of thermoplastic elastomers such as a styrene elastomer, a polyolefin elastomer, a poly(vinyl chloride) elastomer, a polyurethane elastomer, a fluorocarbon rubber elastomer, and a polyethylene chlorinate elastomer; epoxy resin, phenol resin, urea resin, melamine resin, unsaturated polyester, silicone resin, polyurethane, and the like; and copolymers, blends, polymer alloys, and the like that are primarily made of the above-listed materials. The plastic substrate can be a monolayer made of any one of the above-listed materials, or a stacked body in which two or more of the above-listed materials are stacked.

(Gate Electrodes 2a and 2b)

The gate electrodes 2a and 2b are located above the substrate 1, and formed in a predetermined shape by patterning. The gate electrode 2a and the gate electrode 2b are formed so as to be spaced apart from each other. There is no limitation on the material of the gate electrodes 2a and 2b as long as the material has electroconductivity. Examples of the material that can be used for the gate electrodes 2a and 2b include metals selected from chromium, aluminum, tantalum, molybdenum, niobium, titanium, tungsten, copper, silver, gold, platinum, palladium, indium, nickel, neodymium, and the like, or alloys thereof (MoW, etc.); conductive metal oxides such as zinc oxide, tin oxide, indium oxide, and gallium oxide; conductive metal composite oxides such as indium tin oxide (ITO), indium zinc oxide (IZO), aluminum zinc oxide (AZO) and gallium zinc oxide (GZO); conductive polymers such as polyaniline, polypyrrole, polythiophene and polyacetylene, or materials obtained by doping these conductive polymers with dopants including, for example, acids such as hydrochloric acid, sulfuric acid, and sulfonic acid, Lewis acids such as phosphorus hexafluoride, arsenic pentafluoride, and iron chrolide, halogen atoms such as iodine, metal atoms such as sodium, and potassium; and conductive composite materials in which carbon black or metal particles are dispersed. Also, as the material of the gate electrodes 2a and 2b, a polymer mixture containing metal fine particles and conductive particles such as graphite may be used. The above-listed materials may be used singly or in a combination of two or more.

(Gate Insulating Layer 3)

The gate insulating layer 3 is formed so as to face the gate electrodes 2a and 2b. In the present embodiment, the gate insulating layer 3 is formed on the entire surface of the substrate 1 so as to cover the gate electrodes 2a and 2b. The gate insulating layer 3 may be made of an insulating material, or may be made of an organic material or an inorganic material. In the case where the gate insulating layer 3 is made of an organic material, for example, it is possible to use acrylic resin, phenol resin, fluorocarbon resin, epoxy resin, imide resin, novolac resin, or the like. In the case where the gate insulating layer 3 is made of an inorganic material, for example, it is possible to use a metal oxide such as silicon oxide, aluminum oxide, tantalum oxide, zirconium oxide, cerium oxide, zinc oxide, or cobalt oxide, a metal nitride such as silicon nitride, aluminum nitride, zirconium nitride, cerium nitride, zinc nitride, cobalt nitride, titanium nitride, or tantalum nitride, or a metal composite oxide such as barium strontium titanate, or lead zirconium titanate. The above-listed materials may be used singly or in a combination of two or more.

Furthermore, the surface of the gate insulating layer 3 may be treated with a surface treatment agent (ODTS, OTS, HMDS, or βPTS) or the like.

(Source Electrodes 4a and 4b, and Drain Electrodes 5a and 5b)

A pair of the source electrode 4a and the drain electrode 5a, and a pair of the source electrode 4b and the drain electrode 5b are formed on the gate insulating layer 3. In the first thin-film transistor 10a, the source electrode 4a and the drain electrode 5a are disposed in opposing relation above the gate electrode 2a such that the source electrode 4a and the drain electrode 5a are spaced apart from each other in the Y-axis direction by a predetermined distance. The source electrode 4a and the drain electrode 5a are electrically connected to the semiconductor layer 8a. Likewise, in the second thin-film transistor 10b, the source electrode 4b and the drain electrode 5b are disposed in opposing relation above the gate electrode 2b such that the source electrode 4b and the drain electrode 5b are spaced apart from each other in the Y-axis direction by a predetermined distance. The source electrode 4b and the drain electrode 5b are electrically connected to the semiconductor layer 8b.

The source electrodes 4a and 4b, and the drain electrodes 5a and 5b can be made of a conductive material, an alloy thereof, or the like. For example, the same material as the material of the gate electrodes 2a and 2b can be used.

(Partition 6)

The partition (bank) 6 has openings 6a and 6b that respectively define the semiconductor layers 8a and 8b as pixels, and is configured to limit perimeters of the semiconductor layers 8a and 8b. Within the openings 6a and 6b of the partition 6, the surface of the gate insulating layer 3 is included. The surface of the gate insulating layer 3 constitutes the bottom of the partition 6.

Furthermore, within the opening 6a of the partition 6, the source electrodes 4a and the drain electrode 5a are also included, and within the opening 6b of the partition 6, the source electrode 4b and the drain electrode 5b are also included. In the present embodiment, the partition 6 surrounds the source electrode 4a and the drain electrode 5a, as well as the source electrode 4b and the drain electrode 5b.

As described above, the openings 6a and 6b of the partition 6 are configured to cause the gate insulating layer 3, the source electrodes 4a and 4b and the drain electrodes 5a and 5b to be exposed.

Also, the partition 6 has an opening 6c. Within the opening 6c, the connection wiring 20 is formed. That is, the connection wiring 20 is surrounded by the partition 6. The opening 6c is provided to electrically connect the connection wiring 20 and the anode 51 of the organic EL element 50.

As shown in FIG. 3, among the three openings 6a, 6b, and 6c formed in the partition 6, the opening 6a where the source electrode 4a and the drain electrode 5a are exposed at the bottom, and the opening 6b where the source electrode 4b and the drain electrode 5b are exposed at the bottom are portions that function as channel portions. Also, the opening 6c where the connection wiring 20 is exposed at the bottom is a portion that is different from the channel portions, and functions as a contact portion for making contact with the anode 51 of the organic EL element 50.

The partition 6 has insulation properties, and can be formed by using, for example, an organic material such as a resin. Examples of the organic material that can be used for the partition 6 include resin materials such as acrylic resin, polyimide resin, and novolac phenol resin. It is also possible to use an inorganic material as the material of the partition 6. The partition 6 preferably has organic solvent resistance. Furthermore, because an etching process, a baking process, and the like may be performed during production of the thin-film transistors, the partition 6 is preferably made of a material that is highly resistant to deformation and alteration so that it does not excessively deform or alter through these processes.

Also, the partition 6 has certain liquid repellency. The liquid repellency of the partition 6 may be adjusted by the material of the partition 6, or may be adjusted by performing a surface treatment on the partition 6. For example, the liquid repellency can be controlled by using any of the above resin materials as a primary skeleton material of the partition 6 and changing the side chain as appropriate. In other words, the contact angle (surface energy) of the partition 6 can be changed by changing the side chain of the resin constituting the partition 6.

In the present embodiment, a configuration is used in which the liquid repellency of the partition 6 is higher than the liquid repellency of the gate insulating layer 3, and thus the surface of the partition 6 has higher liquid repellency than the surface of the gate insulating layer 3. That is, the contact angle against solvents (water, organic semiconductor material, etc.) of the partition 6 is greater than the contact angle against solvents of the gate insulating layer 3.

Furthermore, the structure of the partition 6 is not limited to a single layer structure, and may be a multilayer structure having two layers or more. In this case, the above-listed materials may be used in combination for each layer, or combined for each layer.

In the case where, for example, a photosensitive resin is used for the partition 6, by partially exposing and developing the photosensitive resin, the openings 6a, 6b, and 6c can be formed.

(Intermediate Layers 7a, 7b, and 7c)

The intermediate layer (first intermediate layer) 7a is formed within the opening 6a of the partition 6. In the first thin-film transistor 10a, the intermediate layer 7a is located between the gate insulating layer 3 and the semiconductor layer 8a. Also, the intermediate layer (second intermediate layer) 7b is formed within the opening 6b of the partition 6. In the second thin-film transistor 10b, the intermediate layer 7b is located between the gate insulating layer 3 and the semiconductor layer 8b. The intermediate layer (third intermediate layer) 7c is formed within the opening 6c of the partition 6, and is formed on the connection wiring 20.

The intermediate layers 7a and 7b are formed on the gate insulating layer 3 so as to be in contact with the gate insulating layer 3, and are respectively formed directly below the semiconductor layers 8a and 8b so as to be in contact with the semiconductor layers 8a and 8b. In other words, the intermediate layers 7a and 7b serve as the underlying layer of the semiconductor layers 8a and 8b.

In the present embodiment, the intermediate layer 7a is also located between the source electrode 4a and the semiconductor layer 8a, and between the drain electrode 5a and the semiconductor layer 8a. That is, the intermediate layer 7a is formed not only directly on the gate insulating layer 3, but also on the source electrode 4a and the drain electrode 5a so as to be in contact with the source electrode 4a and the drain electrode 5a. Likewise, the intermediate layer 7b is also located between the source electrode 4b and the semiconductor layer 8b, and between the drain electrode 5b and the semiconductor layer 8b. That is, the intermediate layer 7b is formed not only directly on the gate insulating layer 3, but also on the source electrode 4b and the drain electrode 5b so as to be in contact with the source electrode 4b and the drain electrode 5b.

Figure 4:
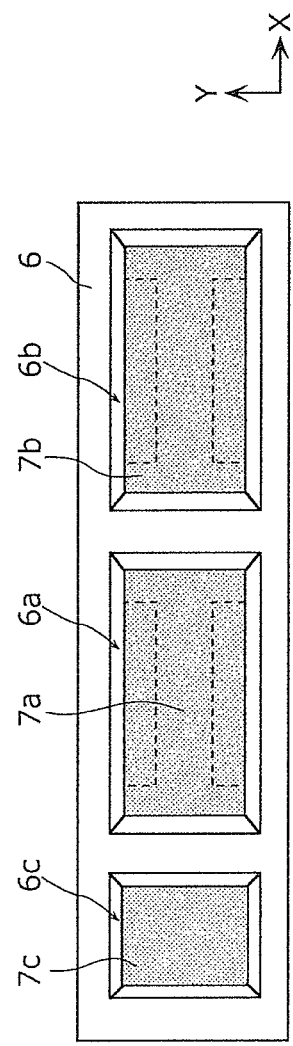
FIG. 4 is a see-through view of (a) of FIG. 3 as viewed through a semiconductor layer.

In this way, in the present embodiment, as shown in FIG. 4, the intermediate layers 7a and 7b are respectively formed on the entire surfaces of the openings 6a and 6b of the partition 6. Note that FIG. 4 is a see-through view of (a) of FIG. 3 as viewed through the semiconductor layers 8a and 8b.

The intermediate layers 7a, 7b, and 7c are made of the same material as the material of the partition 6. Accordingly, the intermediate layers 7a to 7c can be patterned, for example, at the same time the openings 6a to 6c of the partition 6 are formed. To be specific, the intermediate layers 7a to 7c are layers formed by intentionally leaving residues when the partition 6 is patterned, in order to impart desired liquid repellency.

The intermediate layers 7a and 7b are configured to have lower liquid repellency than the liquid repellency of the partition 6. That is, the contact angle against solvents (water and semiconductor ink) of the intermediate layers 7a and 7b is smaller than the contact angle against solvents of the partition 6. Furthermore, the liquid repellency of the intermediate layers 7a and 7b is higher than the liquid repellency of the gate insulating layer 3, and the contact angle of the intermediate layers 7a and 7b is larger than the contact angle of the gate insulating layer 3. The liquid repellency (contact angle) of the intermediate layers 7a and 7b can be adjusted by changing the surface conditions and distribution conditions of the intermediate layers 7a and 7b.

As described above, by forming the intermediate layers 7a and 7b having a large contact angle between the gate insulating layer 3 and the semiconductor layer 8a, and between the gate insulating layer 3 and the semiconductor layer 8b so as to provide the intermediate layers 7a and 7b as the underlying layer of the semiconductor layers 8a and 8b, the surface energy of the underlying layer can be reduced as compared to the case where the gate insulating layer 3 serves as the underlying layer of the semiconductor layers 8a and 8b. With this configuration, the crystallinity of the semiconductor layers 8a and 8b formed on the intermediate layers 7a and 7b (underlying layer) can be improved.

Also, even if process residues remain on the surface of the gate insulating layer 3, because the gate insulating layer 3 is covered by the intermediate layers 7a and 7b, the influence of the process residues can be suppressed. Also, even if there are polar functional groups on the surface of the gate insulating layer 3, because the gate insulating layer 3 is covered by the intermediate layers 7a and 7b, the influence of the polar functional groups can also be suppressed. With this configuration, carrier inducing sites produced by the process residues or the polar functional groups can be reduced, and thus the threshold voltage shift phenomenon in the thin-film transistor can be suppressed.

Here, it is preferable that the intermediate layers 7a and 7b are discretely present. As used herein, "discretely present" refers to a configuration in which there are regions in places where the intermediate layers are not present, for example, a state in which the intermediate layers spaced apart from each other are present with an interval as viewed in cross section.

In the case where the intermediate layer and the partition 6 are simply made of the same material, even if the thickness of the intermediate layers 7a and 7b is reduced to be thin, the contact angle of the intermediate layer and the contact angle of the partition are the same if the intermediate layers 7a and 7b are not formed in island shapes. Thus, the semiconductor formed by an application method may be repelled from the surface of the intermediate layer 7a. To address this, by discretely locating the intermediate layer, the contact angle against water of the intermediate layer can be reduced to be lower than the contact angle against water of the partition while the semiconductor layer is favorably formed on the gate insulating layer, whereby the crystallinity of the semiconductor layer can be improved.

(Semiconductor Layers 8a and 8b)

The semiconductor layer 8a is formed in facing relation to the gate electrode 2a with the gate insulating layer 3 interposed therebetween, and is formed within the opening 6a of the partition 6. The semiconductor layer 8a functions as the channel layer of the first thin-film transistor 10a. Likewise, the semiconductor layer 8b is formed in facing relation to the gate electrode 2b with the gate insulating layer 3 interposed therebetween, and is formed within the opening 6b of the partition 6. The semiconductor layer 8b functions as the channel layer of the second thin-film transistor 10b. In this way, the semiconductor layers 8a and 8b are separated from each other by the partition 6.

In the present embodiment, the semiconductor layers 8a and 8b are formed on the intermediate layers 7a and 7b so as to be in contact with the intermediate layers 7a and 7b.

The semiconductor layers 8a and 8b can be, for example, application type semiconductor layers, and can be formed by applying a semiconductor material to the inside of the openings 6a and 6b of the partition 6 by a printing method such as an inkjet method, followed by crystallization. As the application type semiconductor layers 8a and 8b, organic semiconductor layers using a soluble organic material, or semiconductor oxide layers such as a transparent amorphous oxide semiconductor such as IGZO ($InGaZnO_x$) can be used.

The semiconductor layers 8a and 8b according to the present embodiment are organic semiconductor layers. There is no particular limitation on the material of the organic semiconductor layer as long as the material has semiconductor characteristics and is soluble in a solvent. Examples of the material that can be used for the organic semiconductor layer include α-oligothiophenes such as poly(3-alkylthiophene), poly(3-hexylthiophene) (P3HT), poly(3-octylthiophene), poly(2,5-thienylenevinylene) (PTV), quaterthiophene (4T), sexithiophene (6T), and octathiophene; thiophene derivatives such as 2,5-bis(5'-biphenyl-2'-thienyl)-thiophene (BPT3), and 2,5-[2,2'-(5,5'-diphenyl)dithienyl]-thiophene; phenylene vinylene derivatives such as poly(para-phenylene vinylene) (PPV); fluorene derivatives such as poly(9,9-dioctylfluorene) (PFO); triallylamine polymers; acene compounds such as anthracene, tetracene, pentacene, and hexacene; benzene derivatives such as 1,3,5-tris[(3-phenyl-6-tri-fluoromethyl) quinoxaline-2-yl]benzene (TPQ1), and 1,3,5-tris[{3-(4-t-butylphenyl)-6-trisfluoromethyl}quinoxaline-2-yl ]benzene (TPQ2); phthalocyanine; phthalocyanine derivatives such as copper phthalocyanine (CuPc) and iron phthalocyanine; organic metal compounds such as tris(8-hydroxyquinolinolate)aluminum (Alq3) and fac-tris(2-phenylpyridine)iridium (Ir(ppy)3); polymer compounds such as C60, oxadiazole polymer, triazole polymer, carbazole polymer, and fluorene polymer; and fluorene copolymers such as poly(9,9-dioctylfluorene-co-bis-N,N'-(4-methoxyphenyl)-bis-N,N'-phenyl-1,4-phenylenediarnine) (PFMO), poly(9,9-dioctylfluorene-co-benzothiadiazole) (BT), a fluorene-triallylamine copolymer, and poly(9,9-dioctylfluorene-co-dithiophene) (F8T2). The above-listed materials may be used singly or in a combination of two or more. It is also possible to use, as the material of the application type semiconductor layers 8a and 8b, an inorganic material that is soluble in solvents.

Although not shown, in order to protect the semiconductor layers 8a and 8b, a passivation film (protection film) may be formed so as to cover the semiconductor layers 8a and 8b. As the passivation film, for example, an organic material such as a polymer material such as an acrylic polymer or a low molecular material such as an acrylic monomer can be used.

Also, as shown in (a) and (b) of FIG. 3, within the opening 6c of the partition 6, the connection wiring 20 is formed on the gate insulating layer 3. The connection wiring 20 is the same layer as the source electrodes 4a and 4b and the drain electrodes 5a and 5b, and thus is made of the same material as the material of the source electrodes 4a and 4b and the drain electrodes 5a and 5b.

(Method for Producing Organic EL Display Apparatus)

Figure 5:
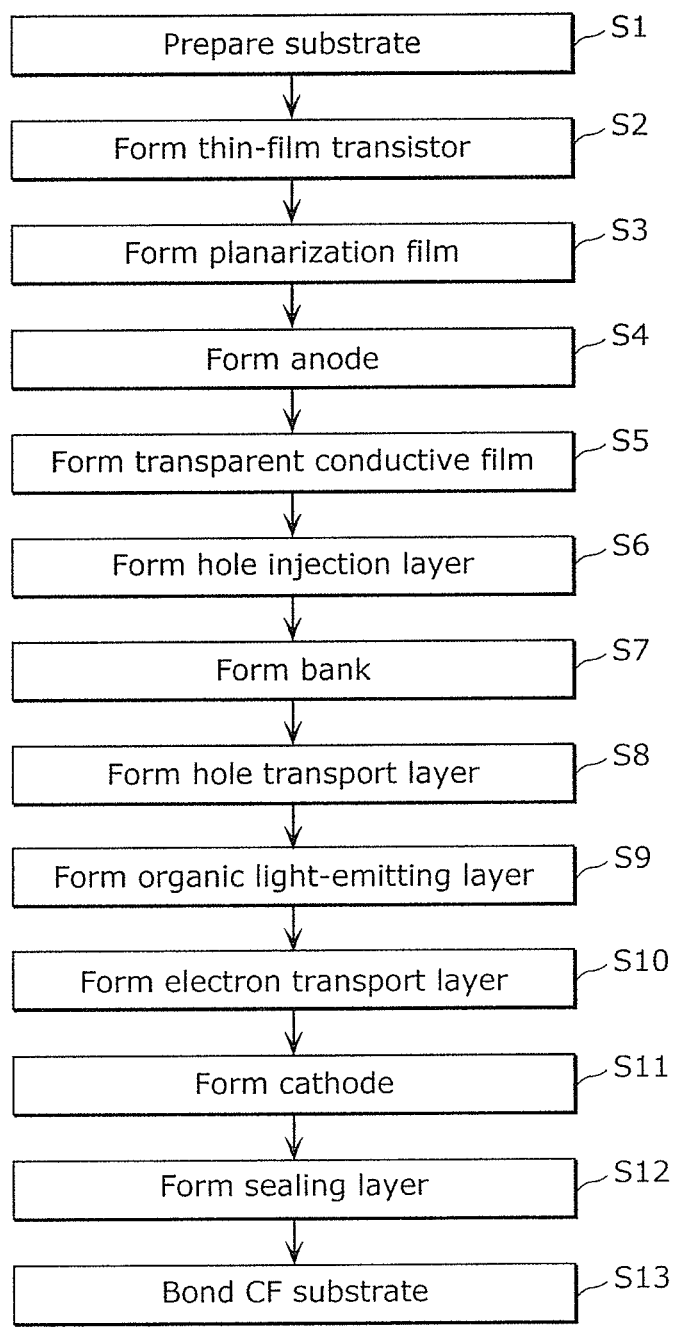
FIG. 5 is a flowchart illustrating a method for producing an organic EL display panel according to Embodiment 1 of the present invention.

A method for producing an organic EL display apparatus 100 according to the present embodiment, in particular, a method for producing an organic EL display panel 110 will be described by using FIG. 5 with reference to FIG. 2. FIG. 5 is a flowchart illustrating a method for producing an organic EL display panel according to Embodiment 1 of the present invention.

As shown in FIG. 5, first, a substrate 1 serving as the base of a TFT substrate 112 is prepared (step S1). For example, a transparent glass substrate may be prepared as the substrate 1. Where necessary, an undercoat layer may be formed on the substrate 1.

Next, a driving circuit portion such as a thin-film transistor is formed on the substrate 1 so as to produce a TFT substrate 112 (step S2). For example, a first thin-film transistor 10a, a second thin-film transistor 10b, and the like are formed on the substrate 1.

Next, a planarization film 40 made of an insulating material is formed on the TFT substrate 112 (step S3). After that, in the planarization film 40, a contact hole 90 is formed at an area corresponding to and above the connection wiring 20 of the TFT substrate 112. Through this step, the upper surface in the Z-axis direction is substantially planarized except for the portion where the contact hole 90 is formed.

Next, an anode 51 is formed on the planarization film 40 (step S4). Here, as shown in FIG. 2, the anode 51 is divided into light-emitting units (sub pixels), and extends along the side wall of the contact hole 90 so as to be connected to the connection wiring 20 of the TFT substrate 112.

The anode 51 can be patterned in a predetermined shape by, for example, forming a metal film by a sputtering method, a vacuum deposition method or the like, and thereafter etching the metal film into sub pixels.

Next, a transparent conductive film 52 is formed so as to cover the upper surface of the anode 51 (step S5). As shown in FIG. 2, the transparent conductive film 52 covers not only the upper surface but also the side surface of the anode 51, and also covers the upper surface of the anode 51 within the contact hole 90. As with the anode 51, the transparent conductive film 52 is formed by forming a conductive film by using a sputtering method, a vacuum deposition method or the like, and thereafter etching the conductive film into sub pixels.

Next, a hole injection layer 53 is formed on the transparent conductive film 52 (step S6). As shown in FIG. 2, the hole injection layer 53 is formed so as to cover the entire surface of the transparent conductive film 52. The hole injection layer 53 may be divided into sub pixels.

In the case where the hole injection layer 53 is made of a metal oxide (for example, tungsten oxide), formation of the metal oxide film can be performed under film forming conditions where, for example, a gas mixture of argon gas and oxygen gas is used as the gas in the chamber of a sputtering apparatus, the total pressure of the gas is greater than 2.7 [Pa] and less than or equal to 7.0 [Pa], and the ratio of the partial pressure of oxygen gas with respect to the total pressure is 50 [%] or greater and 70 [%] or less, and the input power density per unit area of the target is 1 [W/cm$^2$] or greater and 2.8 [W/cm$^2$] or less.

Next, a bank 58 that defines sub pixels is formed (step S7). As shown in FIG. 2, the bank 58 is stacked on the hole injection layer 53.

To form the bank 58, a material layer for the bank 58 is first stacked on the hole injection layer 53. The material layer is formed by a spin coating method or the like using a material containing a photosensitive resin component, such as acrylic resin, polyimide resin or novolac phenol resin, and a fluorine component. As the photosensitive resin, for example, a negative photosensitive material (product number: ZPN1168) available from ZEON Corporation, Japan can be used. Next, the material layer is patterned to form openings corresponding to sub pixels. To be specific, the openings can be formed by placing a mask on the material layer, exposing the material layer to light, and thereafter developing the material layer.

Next, within each opening of the bank 58 on the hole injection layer 53, a hole transport layer 54, an organic light-emitting layer 55, and an electron transport layer 56 are stacked in this order (steps S8, S9, and S10).

The hole transport layer 54 is formed by forming an organic film made of an organic compound by a printing method, and then baking the film. In the same manner, the organic light-emitting layer 55 and the electron transport layer 56 are formed by forming an organic film made of a predetermined organic material by a printing method, and then baking the film.

Next, a cathode 57 and a sealing layer 60 are stacked in this order on the electron transport layer 56 (steps S11, and S12). As shown in FIG. 2, the cathode 57 and the sealing layer 60 are formed on the entire surface of the pixel portion, and are also formed so as to cover the top surface (exposed surface) of the bank 58.

Next, an adhesive layer 70 made of an adhesive resin material is applied onto the sealing layer 60, and a CF substrate 80 prepared in advance is bonded so as to bond the TFT substrate 112 on which an organic EL element 50 has been formed and the CF substrate 80 together (step S13). The CF substrate 80 includes a color filter 82 and a black matrix 83 formed on the underside in the Z-axis direction of a transparent substrate 81.

Through the above steps, an organic EL display panel 110 is produced. Although not illustrated in the diagrams, the organic EL display panel 110 is subjected to an aging process after a driving control circuit portion 120 has been provided to the organic EL display panel 110, whereby an organic EL display apparatus 100 is produced. The aging process is performed by, for example, performing energization on the hole injection layer 53 until the hole mobility reaches 1/10 or less. To be specific, the energization is executed for a predetermined period of time to provide a luminance of an actually used level or more and not greater than three times the actually used level.

(Method for Producing Thin-Film Transistor)

Figure 6:
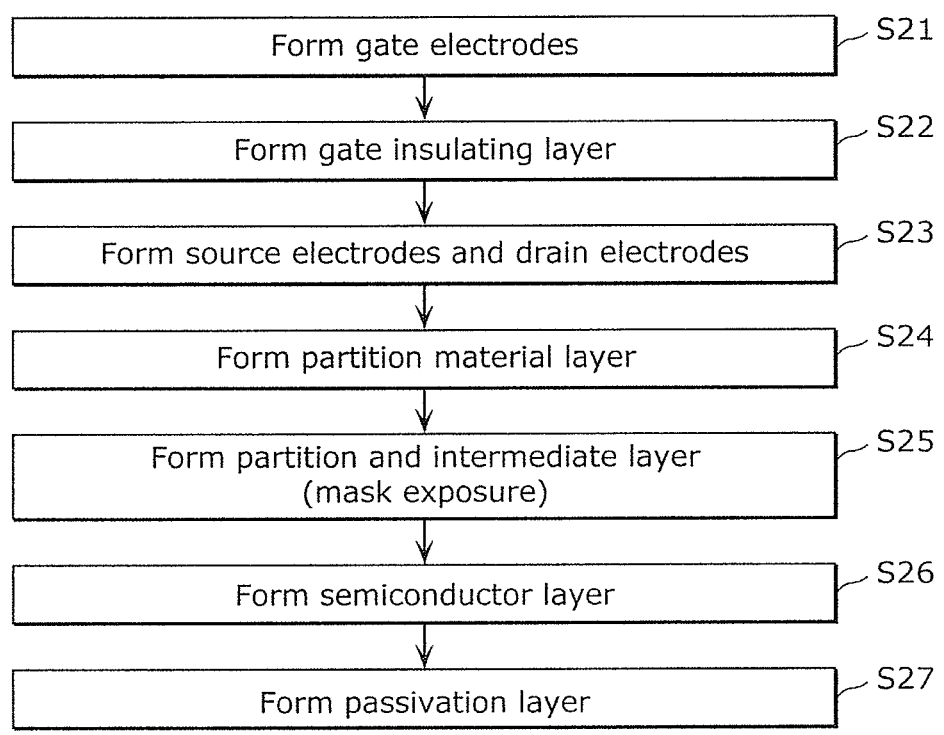
FIG. 6 is a flowchart illustrating the method for producing a thin-film transistor according to Embodiment 1 of the present invention.

Next, a method for producing a thin-film transistor according to the present embodiment will be described with reference to FIG. 6 and FIGS. 7A to 7I. FIG. 6 is a flowchart illustrating a method for producing a thin-film transistor according to Embodiment 1 of the present invention. FIGS. 7A to 7I are composed of X-Z cross-sectional views (a) and Y-Z cross-sectional views (b) of the steps of the method for producing a thin-film transistor according to Embodiment 1 of the present invention. Note that the present embodiment will describe a method for producing a TFT substrate 112 including a first thin-film transistor 10a and a second thin-film transistor 10b. Also, note that the production of thin-film transistors according to the present embodiment corresponds to step S2 of FIG. 5.

Figure 7A:
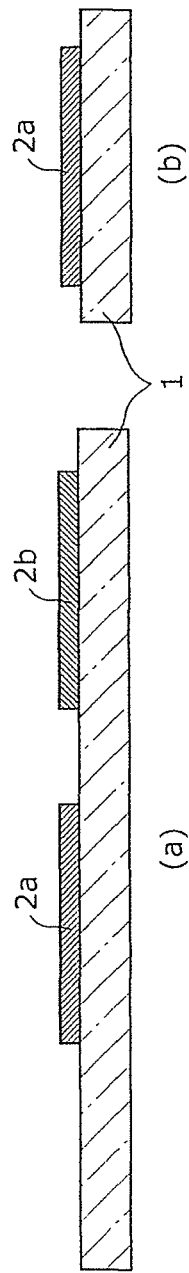
FIG. 7A is composed of cross-sectional view of a gate electrode forming step of the method for producing a thin-film transistor according to Embodiment 1 of the present invention.

As shown in FIGS. 6 and 7A, gate electrodes 2a and 2b having a predetermined shape are formed above the primary surface of a prepared substrate 1 (step S21). The gate electrodes 2a and 2b can be formed by the same method as the anode 51. For example, a material of the gate electrodes 2a and 2b is deposited on the substrate 1 so as to form a metal film, and thereafter the metal film is patterned, whereby the gate electrodes 2a and 2b having a predetermined shape can be formed simultaneously.

Figure 7B:
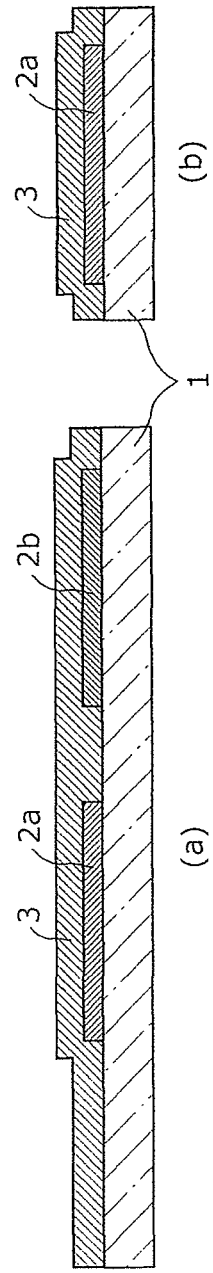
FIG. 7B is composed of cross-sectional views of a gate insulating layer forming step of the method for producing a thin-film transistor according to Embodiment 1 of the present invention.

Next, as shown in FIGS. 6 and 7B, a gate insulating layer 3 is formed above the entire surface of the substrate 1 so as to cover the gate electrodes 2a and 2b (step S22). For example, in the case where an organic material is used as a material of the gate insulating layer 3, the gate insulating layer 3 can be formed by using an application method.

Figure 7C:
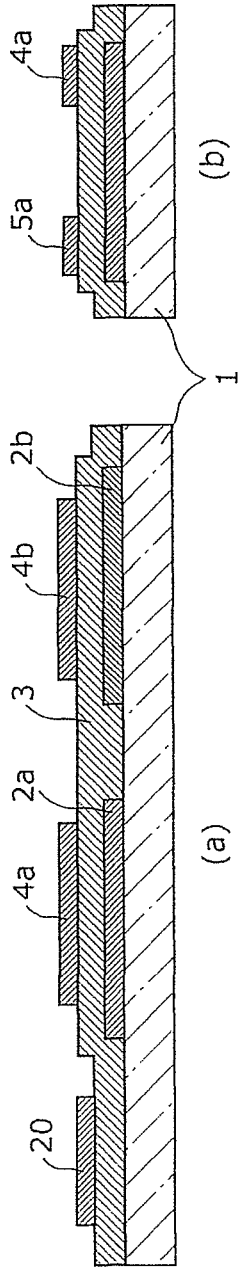
FIG. 7C is composed of cross-sectional views of a step of forming source electrodes and drain electrodes of the method for producing a thin-film transistor according to Embodiment 1 of the present invention.

Next, as shown in FIGS. 6 and 7C, source electrodes 4a and 4b and drain electrodes 5a and 5b are formed on the primary surface of the gate insulating layer 3 (step S23). At this time, connection wiring 20 is also formed. For example, a metal film is formed on the entire surface of the gate insulating layer 3 by depositing a predetermined conductive material on the entire surface of the gate insulating layer 3 under predetermined film forming conditions. After that, the metal film is patterned, whereby the source electrodes 4a and 4b and the drain electrodes 5a and 5b having a predetermined shape and the connection wiring 20 are formed simultaneously.

Next, as shown in FIGS. 6 and 7D, a partition material layer 6A is formed above the gate insulating layer 3 by applying a partition material having higher liquid repellency than the gate insulating layer 3 (step S24). The partition material layer 6A is made of a material for forming the partition 6. To be specific, for example, a photosensitive resist material film is applied and deposited as the partition material layer 6A so as to cover the source electrodes 4a and 4b, the drain electrodes 5a and 5b, the connection wiring 20, and exposed portions of the gate insulating layer 3.

Next, as shown in FIG. 6, the partition material layer 6A is patterned to form a partition 6 having openings 6a to 6c, as well as forming an intermediate layer 7 made of the same material as the material of the partition material layer 6A above the gate insulating layer 3 (step S25).

To be specific, as shown in FIG. 7E, the partition material layer 6A is first exposed to exposure light via a exposure mask 200. For example, mask exposure is performed by placing the exposure mask 200 above the deposited partition material layer 6A.

Here, in the present embodiment, a negative photosensitive resist material is used as the material of the partition material layer 6A. Accordingly, windows 211, 212, 213, and 214 are formed in the exposure mask 200 at positions corresponding to portions where the partition material layer 6A is left. Consequently, the portions of the partition material layer 6A that are irradiated with exposure light through the windows 211 to 214 are exposed to exposure light, and thus remain as the partition 6 after the subsequent developing step.

On the other hand, portions of the exposure mask 200 corresponding to portions where the partition material layer 6A is not left (openings of the partition 6) are configured to receive little exposure light. In other words, in the present embodiment, a configuration is intentionally adopted in which exposure light reaches the partition material layer 6A, even the portions corresponding to the openings of the partition 6. To be specific, in the exposure mask 200, besides the regions where the windows 211 to 214 are formed, windows 221, 222, and 223 are formed at positions corresponding to portions where the partition material layer 6A is left as the intermediate layers 7a to 7c. However, the windows 211 to 214, which are portions corresponding to the openings of the partition 6, are configured to have a smaller exposure light transmittance than the exposure light transmittance of the windows 221 to 223.

After the partition material layer 6A has been exposed to light, the partition material layer 6A is patterned by developing the partition material layer 6A with a developing solution. By doing so, as shown in FIG. 7F, a partition 6 having openings 6a to 6c is formed, and at the same time, intermediate layers 7a to 7c are formed within the openings 6a to 6c. In the present embodiment, the intermediate layer 7a is formed on the entire surface of the opening 6a, and is formed so as to cover the source electrode 4a, the drain electrode 5a, and the exposed surface of the gate insulating layer 3. Also, the intermediate layer 7b is formed on the entire surface of the opening 6b, and is formed so as to cover the source electrode 4b, the drain electrode 5b, and the exposed surface of the gate insulating layer 3. Also, the intermediate layer 7c is formed on the entire surface of the opening 6c, and is formed so as to cover the connection wiring 20.

In this case, residues that remain after patterning of the partition material layer 6A (hereinafter referred to as "pattern residues") can be left as desired as the intermediate layers 7a to 7c by adjusting the developing conditions such as the developing time, the developing temperature, and the developing solution. In other words, by adjusting the amount of pattern residues of the partition material layer 6A during development and using the pattern residues as intermediate layers, the intermediate layers 7a to 7c can be formed at the same time the partition 6 is formed.

In this way, in the present embodiment, control is performed such that the partition material layer 6A is intentionally left at positions corresponding to the openings 6a to 6c of the partition 6 so as to serve as the intermediate layers 7a to 7c having desired liquid repellency (contact angle). To be specific, in the step of forming the intermediate layers 7a to 7c, the intermediate layers 7a and 7b are formed so as to have a smaller contact angle against water than the contact angle against water of the partition 6. For example, the intermediate layers 7a and 7b can be formed such that at least a part of the region of the intermediate layers 7a and 7b that is to be in contact with the semiconductor layers 8a and 8b has a contact angle against water of 40 degrees or more and 70 degrees or less.

Furthermore, in the present embodiment, a material having higher liquid repellency than the liquid repellency of the gate insulating layer 3 is used as the material of the partition material layer 6A. It is thereby possible to form, above the gate insulating layer 3, the intermediate layers 7a to 7c having higher liquid repellency than the liquid repellency of the gate insulating layer 3. Because the surface energy can be reduced as compared to the case where the gate insulating layer 3 is exposed, the crystallinity of the semiconductor layers 8a and 8b can be improved.

Also, in the present embodiment, the intermediate layers 7a and 7b are formed not only above the gate insulating layer 3 but also on the surface of the source electrodes 4a and 4b and the drain electrodes 5a and 5b. As a result of the intermediate layers 7a and 7b having a small surface energy being present on the source electrodes 4a and 4b and the drain electrodes 5a and 5b, the crystallinity of the semiconductor layers 8a and 8b formed on these electrodes can also be improved. It is thereby possible to improve the crystallinity of the channel portion (semiconductor layer) on the gate insulating layer 3 around the source electrodes 4a and 4b and the drain electrodes 5a and 5b.

Also, the intermediate layers 7a and 7b are formed both on the source electrodes 4a and 4b (the drain electrodes 5a and 5b) and on the gate insulating layer 3, whereby the surface energy above the source electrodes 4a and 4b (the drain electrodes 5a and 5b) and the surface energy above the gate insulating layer 3 can be set to values close to each other. This makes it difficult for grain boundaries to occur in the semiconductor layers 8a and 8b formed between the source electrodes 4a and 4b (the drain electrodes 5a and 5b) and the gate insulating layer 3, and thus the crystallinity of the semiconductor layer can be improved. In this way, by improving the crystallization of the semiconductor layers 8a and 8b, transistor characteristics, carrier mobility in particular, can be improved. Furthermore, the influence of the crystallinity of the semiconductor layers 8a and 8b in the vicinity of the source electrodes 4a and 4b (the drain electrodes 5a and 5b)

increases as the channel length, or in other words, the distance between the source electrode 4a (the source electrode 4b) and the drain electrode 5a (the drain electrode 5b) facing each other is reduced. Accordingly, the effect of improving mobility described above is effective for thin-film transistors having a small channel length. Note that in particular the regions on the source electrodes 4a and 4b (the drain electrodes 5a and 5b) serve as the regions (contact regions) where the channel region of the semiconductor layers 8a and 8b is in contact with the source electrodes 4a and 4b (the drain electrodes 5a and 5b), and thus it is desirable that the crystallinity of the semiconductor layers 8a and 8b is high.

Next, as shown in FIG. 6, the semiconductor layers 8a and 8b are respectively formed within the openings 6a and 6b of the partition 6 so as to be in contact with the intermediate layers 7a and 7b (step S26).

To be specific, after the partition 6 has been formed, as shown in FIG. 7G, organic semiconductor ink droplets 8aA and 8bA for forming the semiconductor layers 8a and 8b are applied to the openings 6a and 6b defined by the partition 6. For example, as the organic semiconductor ink 8aA and 8bA, a solution containing a semiconductor material (semiconductor solution) is applied by ink jet method.

After that, the organic semiconductor ink droplets 8aA and 8bA are dried. As a result, as shown in FIG. 7H, semiconductor layers 8a and 8b are formed in the openings 6a and 6b.

Finally, as shown in FIGS. 6 and 7I, a passivation film 9 is formed so as to entirely cover the semiconductor layers 8a and 8b and the partition 6, except for the opening 6c (step S27).

Through the above processing, a first thin-film transistor 10a and a second thin-film transistor 10b are produced, whereby a TFT substrate 112 is obtained.

Next, an experiment was conducted to determine whether the desired intermediate layer 7a had been formed on the gate insulating layer 3 in the first thin-film transistor 10a by actually producing a TFT substrate 112 by using the above described method. In this experiment, the partition 6 was formed by using a fluorine-containing photosensitive resin having liquid repellency. The presence or absence of the intermediate layer 7a was checked by XPS (X-ray Photoelectron Spectroscopy). Hereinafter, results of XPS measurement will be described with reference to FIG. 8. FIG. 8 is a diagram showing results obtained by XPS measurement of the surface of the gate insulating layer in an opening of the partition before and after formation of the partition. In FIG. 8, curve A indicates a result obtained by XPS measurement of the surface of the gate insulating layer 3 before formation of the partition 6. Curve B indicates a result obtained by XPS measurement of the surface of the gate insulating layer 3 within an opening of the partition 6 after formation of the partition 6.

As shown in FIG. 8, curve A (before formation of the partition) shows a C1s spectrum of a normal level of air pollution. On the other hand, curve B (after formation of the partition) shows an increase in the absolute amount of attached carbon in the C1s spectrum, as well as a C-F derived peak around a bond energy of 288 eV. In other words, it can be seen that a resin component derived from the partition 6 is formed on the gate insulating layer 3. With this experiment, it was confirmed that the desired intermediate layer 7a had been formed on the gate insulating layer 3.

Also, the thickness of the intermediate layer 7a was measured with an AFM (Atomic Force Microscope), and found to be not greater than 1 nm. The thickness of the intermediate layer 7a can be controlled by adjusting the developing conditions of the partition material layer 6A, but the thickness of the intermediate layer 7a may be adjusted by acid/alkaline cleaning, UV-O3, O2 plasma processing, or the like.

In the case where the thin-film transistors have a bottom contact structure, the thickness of the intermediate layer formed above the gate insulating layer is preferably smaller than the thickness of the source electrode (the drain electrode). By doing so, the source electrode (the drain electrode) can be brought into contact with the channel region of the semiconductor layer. As a result, it is possible to suppress the elevation of contact resistance caused by the intermediate layer between the source electrode (the drain electrode) and the semiconductor layer.

Next is a description of preferred liquid repellency of the surface of the intermediate layer 7a. In other words, a preferable range of the contact angle of the intermediate layer 7a will be described.

First, when the contact angle of the intermediate layer 7a (the contact angle against water of the intermediate layer 7a) measured by using water as the solvent exceeds 70 degrees, the semiconductor ink applied to the opening 6a of the partition 6 is repelled from the surface of the intermediate layer 7a, and as a result an unwet area that is not wet with the semiconductor ink is formed within the opening 6a of the partition 6. That is, the semiconductor ink cannot be applied to the entire surface of the opening 6a. An experiment showed that when the contact angle against water of the intermediate layer 7a was 75 degrees, the semiconductor ink was repelled from the surface of the intermediate layer 7a, and thus the semiconductor layer 8a was not favorably formed, but when the contact angle against water of the intermediate layer 7a was 70 degrees, the semiconductor layer 8a was favorably formed within the opening 6a of the partition 6. That is, it was found that the desired wetting properties can be obtained by reducing the contact angle of the intermediate layer 7a to at least 70 degrees. Accordingly, it is preferable that the contact angle against water of the intermediate layer 7a is 70 degrees or less.

Also, the contact angle of the intermediate layer 7a was successfully reduced to 70 degrees or less by discretely locating the intermediate layer 7a.

When the contact angle against water of the intermediate layer 7a is less than 40 degrees, polar functional groups that increase surface energy start appearing on the surface of the intermediate layer 7a. This degrades the crystallinity of the semiconductor layer 8a formed on the intermediate layer 7a. Also, the polar functional groups on the intermediate layer 7a form carrier inducing sites in the semiconductor layer 8a, and thus the threshold voltage shifts. Therefore, by setting the contact angle against water of the intermediate layer to 40 degrees or more, it is possible to prevent polar functional groups from appearing on the surface of the intermediate layer 7a, and thus the degradation of the crystallinity of the semiconductor layer 8a can be prevented, and the threshold voltage shift due to the carrier inducing sites can be suppressed. As a result, good transistor characteristics can be obtained.

As described above, by setting the contact angle against water of the intermediate layer 7a serving as the underlying layer of the semiconductor layer 8a to 40 degrees or more and 70 degrees or less, the crystallinity of the semiconductor layer 8a can be improved while the semiconductor ink wetting properties are secured, and also the threshold voltage shift can be suppressed. In other words, both semiconductor ink wetting properties and good transistor characteristics can be obtained.

Figure 9:
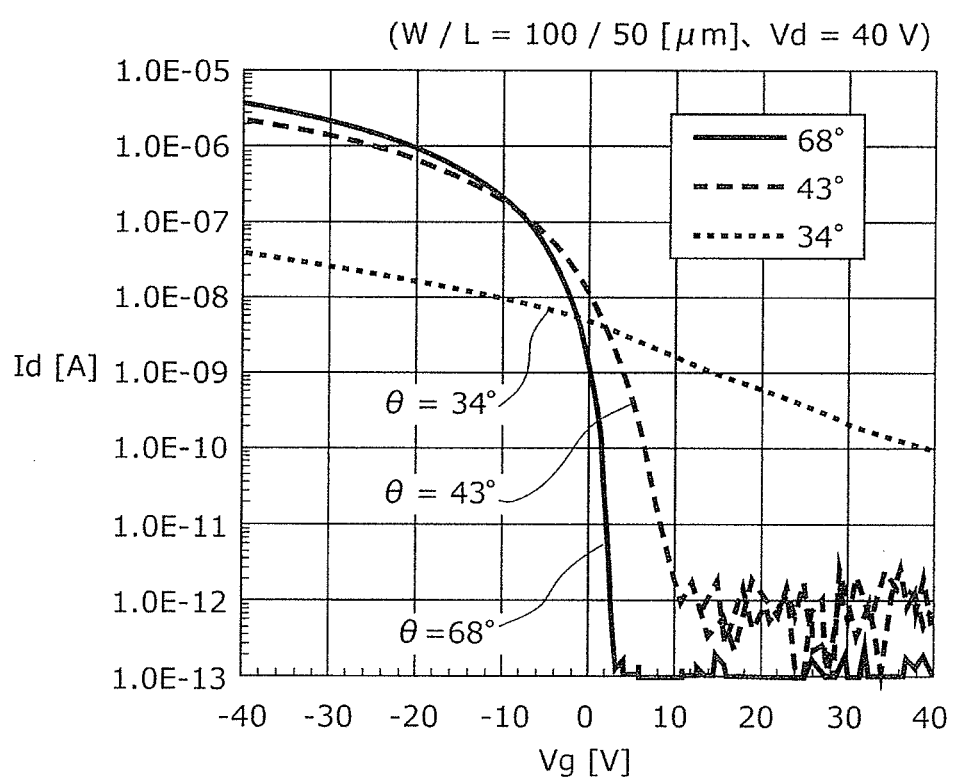
FIG. 9 a diagram showing Vgs-Ids characteristics of the thin-film transistor according to Embodiment 1 of the present invention when the contact angle θ of the gate insulating layer on which the intermediate layer has been formed is 68 degrees, 43 degrees, and 34 degrees.

Here, the threshold voltage of each thin-film transistor was measured by changing the contact angle against water of the intermediate layer 7a (in other words, by changing the surface energy of the intermediate layer 7a). FIG. 9 shows the results. FIG. 9 is a diagram showing Vgs-Ids characteristics of each thin-film transistor when the contact angle θ against water of the gate insulating layer on which the intermediate layer has been formed is 68 degrees, 43 degrees, and 34 degrees. Note that in this experiment, the gate insulating layer 3 was a silicon thermal oxide film, the partition 6 was made of fluorocarbon resin, and the semiconductor layer 8a was an organic semiconductor layer.

As shown in FIG. 9, it can be seen that when the contact angle θ is 68 degrees, there is substantially no shift in the threshold voltage. When the contact angle θ is 43 degrees, however, the threshold voltage increases slightly, and when the contact angle θ is 34 degrees, the threshold voltage shifts significantly.

The threshold voltage Vth was obtained from Vgs-Ids (both axes are linear) characteristics. To be specific, the voltage at the intersection between an extended line of a portion where Ids is linear and the X axis at Ids=0 was defined as the threshold voltage Vth.

When the threshold voltage Vth is within a range of about −5V to 5V, the threshold voltage Vth can be relieved by adjusting the gate voltage Vg, and thus the threshold voltage Vth is preferably within a range ranging from −5V to 5V. In order to satisfy this condition, the contact angle against water of the intermediate layer is preferably 40 degrees or more.

Although the contact angle of the intermediate layer 7a can be controlled by adjusting the developing conditions of the partition material layer 6A or adjusting the pre-baking temperature of the partition material layer 6A, the contact angle of the intermediate layer 7a may be adjusted by using the following methods as appropriate. For example, the lyophilicity can be improved by irradiating the surface of the intermediate layer 7a with excimer UV or UV ozone. In other words, the contact angle can be reduced. It is also possible to reduce the contact angle by increasing the amount of exposure light when the partition material layer 6A is exposed to light, and reducing the area where the intermediate layer 7a is formed so as to increase the exposed area of the gate insulating layer 3 that is exposed from the intermediate layer 7a.

As described above, in the thin-film transistor (the first thin-film transistor 10a and the second thin-film transistor 10b) according to Embodiment 1 of the present invention, the intermediate layers 7a and 7b made of the same material as the material of the partition 6 having higher liquid repellency than the gate insulating layer 3 is formed between the semiconductor layers 8a and 8b and the gate insulating layer 3 so as to be in contact with the semiconductor layers 8a and 8b. To be specific, as the underlying layer of the semiconductor layers 8a and 8b, the intermediate layers 7a and 7b having a contact angle larger than the contact angle of the gate insulating layer 3 are formed. In other words, the intermediate layers 7a and 7b having a surface energy smaller than the surface energy of the gate insulating layer 3 are formed directly below the semiconductor layers 8a and 8b. With this configuration, the surface energy of the underlying layer (the intermediate layers 7a and 7b) of the semiconductor layers 8a and 8b can be reduced as compared to when the intermediate layers 7a and 7b are not formed between the semiconductor layers 8a and 8b and the gate insulating layer 3, and thus the gate insulating layer 3 is exposed. Accordingly, the crystallinity of the semiconductor layers 8a and 8b can be improved. As a result, in the present embodiment, the carrier mobility can be improved as compared to when the semiconductor layer is formed on the exposed portion of the gate insulating layer 3.

Also, in the thin-film transistor according to the present embodiment, the intermediate layers 7a and 7b made of the same resin component as that of the partition 6 are formed as the underlying layer of the semiconductor layers 8a and 8b. Accordingly, the intermediate layers 7a and 7b can be formed at the same time the partition 6 is formed by patterning. Accordingly, the number of production steps and the cost can be suppressed as compared to the case where the intermediate layers 7a and 7b are made of a different material.

Also, in the thin-film transistor according to the present embodiment, the intermediate layers 7a and 7b are formed between the semiconductor layers 8a and 8b and the gate insulating layer 3. Accordingly, residues that remain on the surface of the gate insulating layer 3 (process residues that remain after production of the transistor) and the exposed surface of the gate insulating layer 3 can be covered by the intermediate layers 7a and 7b. Therefore, the process residues and the carrier inducing sites caused by the polar functional groups on the gate insulating layer 3 can be reduced, and thus the threshold voltage shift phenomenon of the thin-film transistor can be suppressed.

Also, in the present embodiment, the contact angle against water of the intermediate layer 7a of the first thin-film transistor 10a (driving transistor) is preferably greater than the contact angle against water of the intermediate layer 7b of the second thin-film transistor 10b (switching transistor).

The driving transistor is required to have superior on-characteristics than the switching transistor, and thus the carrier mobility of the driving transistor is preferably higher than the carrier mobility of the switching transistor.

Accordingly, by setting the contact angle against water of the intermediate layer 7a of the first thin-film transistor 10a (driving transistor) to be greater than the contact angle against water of the intermediate layer 7b of the second thin-film transistor 10b (switching transistor), the crystallinity of the semiconductor layer 8a of the first thin-film transistor 10a (driving transistor) can be increased as compared to that of the semiconductor layer 8b of the second thin-film transistor 10b (switching transistor). As a result, the carrier mobility of the first thin-film transistor 10a (driving transistor) can be increased as compared to the carrier mobility of the carrier mobility of the second thin-film transistor 10b (switching transistor), and thus the on-characteristics of the first thin-film transistor 10a (driving transistor) can be improved more than the on-characteristics of the second thin-film transistor 10b (switching transistor).

Generally, as the method for reducing polar functional groups on the gate insulating layer, a method is known in which a monomolecular film is formed on the surface of the gate insulating layer by using a surface treatment agent having a silanol group. With this method, however, the functional groups on the surface (underlying layer) to be modified have selectivity, and thus etching residues and the like of source electrode (drain electrode) are not modified, and thus become bare. In contrast, in the present embodiment, the surface of the gate insulating layer 3 is covered with resides of the resin of the partition 6, and thus all of the process residues (etching residues produced by etching the source electrode and the like) that are present on the gate insulating layer 3 are also covered. That is, with the method of the present embodiment, any underlying layer can be used, and thus the present invention is applicable regardless of the material of the underlying layer.

As described above, according to the present embodiment, a thin-film transistor having excellent transistor characteristics can be achieved while suppressing the load in terms of the number of production steps and the cost. Accordingly, the TFT substrate 112 that uses the thin-film transistor according to the present embodiment, the organic EL display panel 110 including the TFT substrate 112, and the organic EL display apparatus 100 including the organic EL display panel 110 have the effects of being high quality and having a high production yield.

Also, in the present embodiment, the intermediate layers 7a and 7b are formed so as to cover the entire surface of the gate insulating layer 3, but the present invention is not limited thereto. It is also possible to use a configuration in which, for example, the intermediate layers 7a and 7b cover a part of the surface of the gate insulating layer 3 so that the gate insulating layer 3 and the semiconductor layers 8a and 8b are in contact with each other. That is, the intermediate layers 7a and 7b may be formed in island shapes on the gate insulating layer 3.

As described above, with the configuration in which a part of the gate insulating layer 3 is covered with the intermediate layers 7a and 7b, and the other part of the gate insulating layer 3 is made contact with the semiconductor layers 8a and 8b, not only improvement in the crystallinity of the semiconductor layers 8a and 8b and suppression of the threshold voltage shift can be achieved, but also the desired gate voltage Vg can be applied to the semiconductor layers 8a and 8b by causing the gate insulating layer 3 and the semiconductor layers 8a and 8b to be in contact with each other. Accordingly, a high-quality thin-film transistor can be achieved. Furthermore, in this case, it is also possible to suppress an increase in the production cost of the thin-film transistor.

In Embodiment 1, in order for the intermediate layers 7a and 7b to have specific properties, the contact angle against water of the intermediate layers 7a and 7b is specified. However, when the thickness of the intermediate layers 7a and 7b is relatively thin, within the surface of the intermediate layers 7a and 7b, there may partially be a non-uniform region (the region in which the intermediate layers 7a and 7b are intermittently formed in the shape of islands). In this case, the liquid repellency on the intermediate layers 7a and 7b is affected not only by the surface condition of the intermediate layers 7a and 7b but also by the surface condition of the gate insulating layer 3.

For this reason, in this specification, "the contact angle against water of the intermediate layer" encompasses not only the "contact angle against water of the intermediate layer" but also "the contact angle against water of the gate insulating layer on which the intermediate layer is formed".

To be more specific, it is preferable that the contact angle against water of the gate insulating layer 3 on which the intermediate layers 7a and 7b are formed is smaller than the contact angle against water of the partition 6.

Also, in at least a part of the region of the intermediate layers 7a and 7b that is in contact with the semiconductor layers 8a and 8b, the contact angle against water of the gate insulating layer 3 on which the intermediate layers 7a and 7b are formed is preferably 40 degrees or more, or 40 degrees or more and 0 degrees or less.

The notion that "the contact angle against water of the intermediate layer" encompasses "the contact angle against water of the gate insulating layer on which the intermediate layer is formed" applies to Embodiment 2 and subsequent embodiments.

(Embodiment 2)

Figure 10:
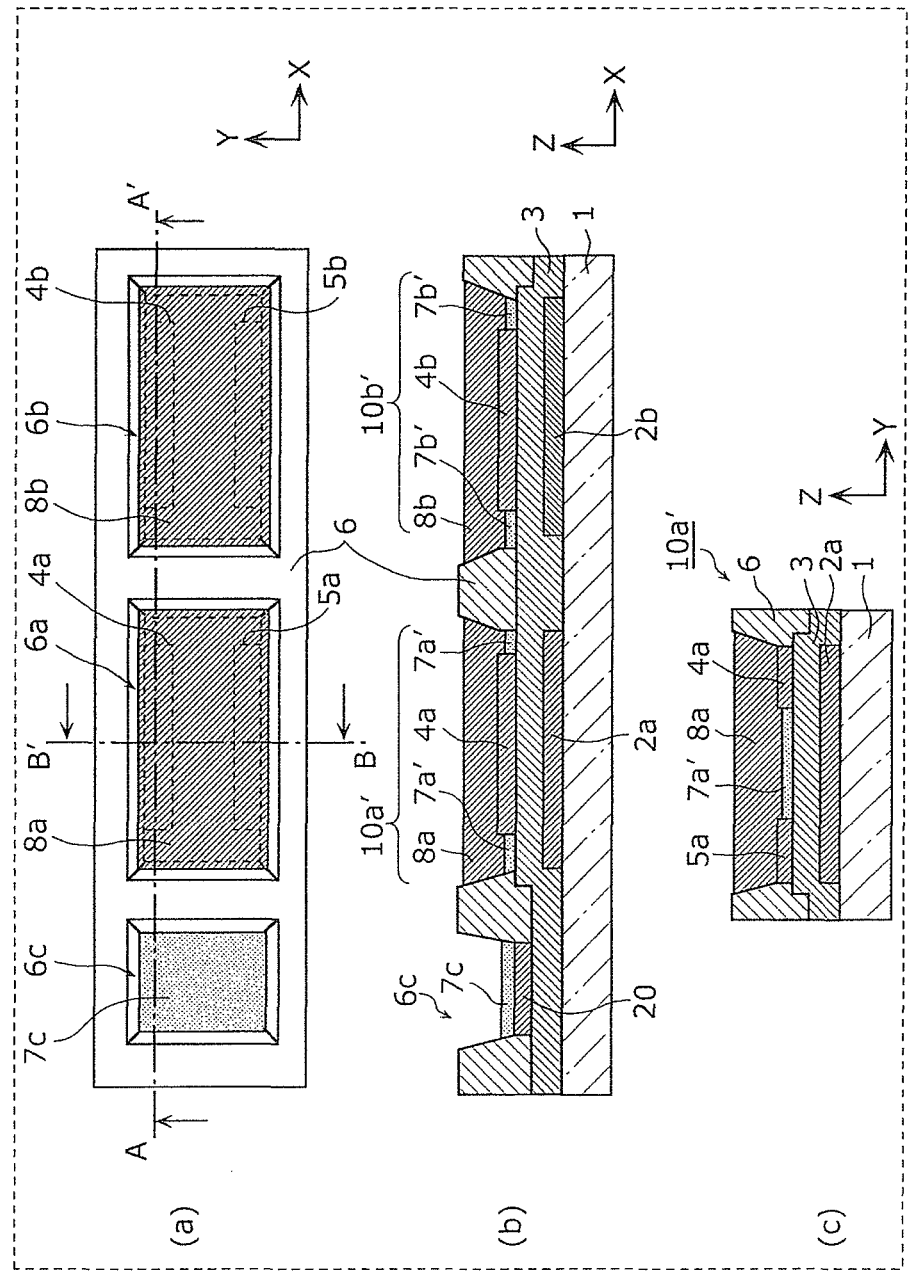
FIG. 10, (a) is a plan view showing a configuration of thin-film transistors and connection wiring according to Embodiment 2 of the present invention, (b) is a cross-sectional view taken along the line A-A' in (a) of FIG. 10, and (c) is a cross-sectional view taken along the line B-B' in (a) of FIG. 10.
Figure 11:
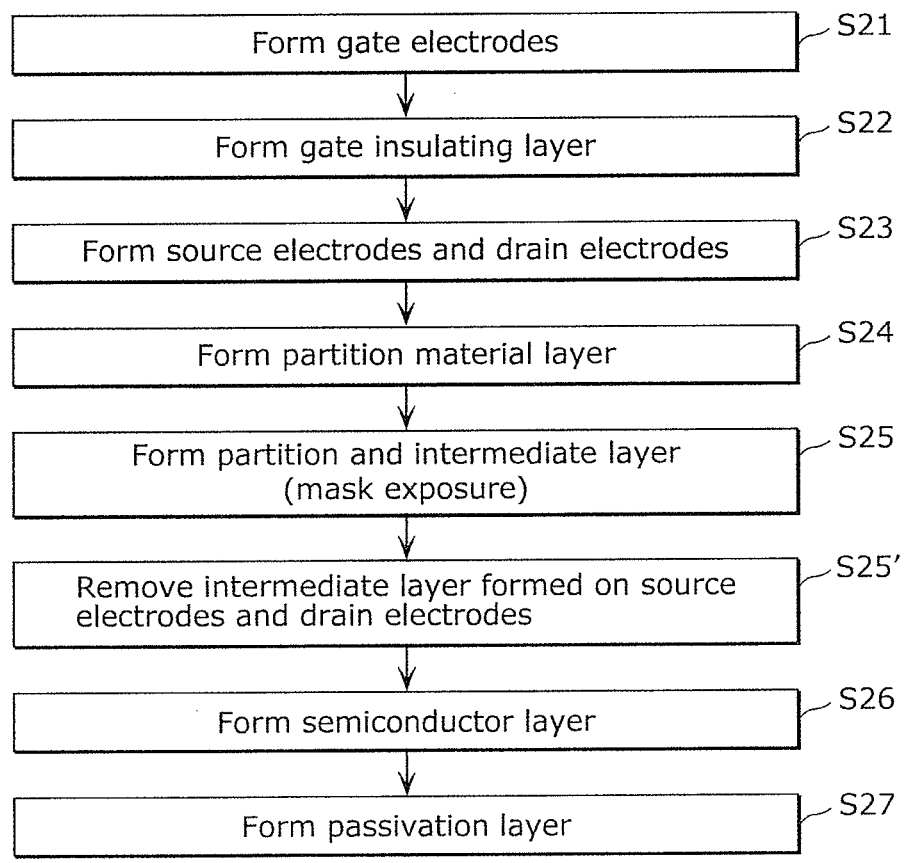
FIG. 11 is a flowchart illustrating a method for producing a thin-film transistor according to Embodiment 2 of the present invention.

Embodiment 2 of the present invention will be described next with reference to FIGS. 10 and 11. FIG. 10 shows a thin-film transistor according to Embodiment 2 of the present invention, with (a) being a plan view (X-Y plan view), (b) being a cross-sectional view taken along the line A-A' in (a) of FIG. 10 (X-Z cross-sectional view), and (c) being a cross-sectional view taken along the line B-B' in (a) of FIG. 10 (Y-Z cross-sectional view). FIG. 10 is a diagram corresponding to FIG. 3 of Embodiment 1 described above. Also, FIG. 11 is a flowchart illustrating a method for producing a thin-film transistor according to Embodiment 2 of the present invention.

In the present embodiment, the other structural elements (organic EL display panel, organic EL display apparatus) that are not shown are the same as those of Embodiment 1 described above, and thus illustrations and descriptions thereof are omitted here. The present embodiment will be described focusing on the difference from Embodiment 1.

Embodiment 2 is different from Embodiment 1 in the configuration of the intermediate layer. That is, Embodiment 1 has a configuration in which the intermediate layer having a uniform thickness is formed on the entire surface of the openings of the partition 6 and the intermediate layer is formed not only directly on the gate insulating layer but also directly on the source electrode and the drain electrode. In contrast, in the present embodiment, a configuration will be described in which the thickness of the intermediate layer located between at least one of the source electrode and the drain electrode and the semiconductor layer is smaller than the thickness of the intermediate layer located between the gate insulating layer and the semiconductor, or in which the intermediate layer is not formed on the source electrode and the drain electrode and thus is formed only on the gas insulating layer. In the present embodiment, a case will be described in which the intermediate layer is formed only on the gate insulating layer as shown in FIG. 10.

As shown in FIG. 10, the thin-film transistor (a first thin-film transistor 10a' and a second thin-film transistor 10b') according to the present embodiment is the same as Embodiment 1 in that intermediate layers 7a' and 7b' are located between the gate insulating layer 3 and the semiconductor layer 8a and between the gate insulating layer 3 and the semiconductor layers 8b, respectively, and at least a part thereof is in contact with the semiconductor layers 8a and 8b.

However, in Embodiment 1, the intermediate layers 7a and 7b are formed not only directly on the gate insulating layer 3 but also directly on the source electrodes 4a and 4b and the drain electrodes 5a and 5b, whereas in the present embodiment, the intermediate layers 7a' and 7b' are not formed directly on the source electrodes 4a and 4b and the drain electrodes 5a and 5b, and thus formed directly only on the gate insulating layer 3.

When there is an intermediate layer between at least one of the source electrodes 4a and 4b and the drain electrodes 5a and 5b and the semiconductor layer 8a or 8b as in Embodiment 1, depending on the thickness of the intermediate layer, the intermediate layer may act as a barrier for carrier injection from the source electrodes 4a and 4b (the drain electrodes 5a and 5b) to the semiconductor layers 8a and 8b, causing deterioration in transistor characteristics.

To address this, in the present embodiment, a configuration is used in which the intermediate layers 7a' and 7b' having higher liquid repellency than the gate insulating layer 3 are formed directly on the gate insulating layer 3 that significantly influences the crystallinity of the semiconductor layers 8a and 8b, and the intermediate layers are not formed between the source electrodes 4a and 4b (the drain electrodes 5a and 5b) and the semiconductor layers 8a and 8b. With this configuration, there is no intermediate layer on the source electrodes 4a and 4b (the drain electrodes 5a and 5b), and thus the source electrodes 4a and 4b (the drain electrodes 5a and 5b) come into contact with the semiconductor layers 8a and 8b. As a result, the crystallinity of the semiconductor layer can be improved, and at the same time, the contact resistance between the source electrodes 4a and 4b (the drain electrodes 5a and 5b) and the semiconductor layers 8a and 8b can be reduced to reduce the carrier injection barrier. Accordingly, a thin-film transistor having more excellent transistor characteristics than the thin-film transistor of Embodiment 1 can be achieved.

As shown in FIG. 11, the configuration of the thin-film transistor according to the present embodiment can be formed by removing the intermediate layer formed on the source electrodes 4a and 4b and the drain electrodes 5a and 5b in a step between step S25 and step S26 of Embodiment 1.

To be specific, as a method of removing the intermediate layer (residues of the partition) on the source electrodes 4a and 4b and the drain electrodes 5a and 5b, the following methods can be used: a method in which the resin of the partition material layer 6A is decomposed by short wavelength light or laser light; or in the case where a metal material that is easily dissolved in acid or alkali is used as the electrode material of the source electrodes 4a and 4b (the drain electrodes 5a and 5b), a method in which the surface of the source electrodes 4a and 4b (the drain electrodes 5a and 5b) is oxidized by heat, light or ozone to form a surface oxide, and thereafter the surface oxide is removed by lift-off.

For example, when molybdenum is used for the source electrodes 4a and 4b (the drain electrodes 5a and 5b), a molybdenum oxide formed on the surface layer of molybdenum can be removed by washing with water. In this case, the intermediate layer is formed above the molybdenum oxide and above the gate insulating layer 3, and thereafter the TFT substrate is washed with water, whereby it is possible to remove the molybdenum oxide and the intermediate layer formed on the surface of the molybdenum electrodes while the intermediate layers 7a' and 7b' are remained above the gate insulating layer 3.

As another example of the present embodiment, when the thickness of the intermediate layer located between the source electrodes 4a and 4b (the drain electrodes 5a and 5b) and the semiconductor layers 8a and 8b is smaller than the thickness of the intermediate layer located between the gate insulating layer 3 and the semiconductor layers 8a and 8b, for example, in the step of exposing the partition material layer 6A to light, the above configuration can be formed by adjusting the amount of exposure light to the partition material layer 6A.

To be specific, when the partition material layer 6A made of a negative photosensitive material is exposed to light, an exposure mask is used that is configured to have a higher exposure light transmittance above the partition material layer 6A located on the gate insulating layer 3 than the exposure light transmittance above the partition material layer 6A located on the source electrodes 4a and 4b (the drain electrodes 5a and 5b), and the exposure mask is placed on the gate insulating layer 3.

To be more specific, a light blocking mask is placed on the source electrodes 4a and 4b and the drain electrodes 5a and 5b, and a halftone mask is placed on the gate insulating layer 3, and then, the partition material layer 6A is exposed to light. After that, by performing a developing process, the partition 6 and the intermediate layers 7a' and 7b' can be formed. By doing so, the thickness of the intermediate layer on the source electrodes 4a and 4b (the drain electrodes 5a and 5b) can be reduced to be smaller than the thickness of the intermediate layer on the gate insulating layer 3.

Alternatively, the thickness of the intermediate layer can also be reduced by irradiating the intermediate layer with laser light. To be specific, after the intermediate layer has been formed above the gate insulating layer 3 and above the source electrodes 4a and 4b (the drain electrodes 5a and 5b), the intermediate layer formed above the source electrodes 4a and 4b (the drain electrodes 5a and 5b) is selectively irradiated with laser light. By doing so, the thickness of the intermediate layer formed above the source electrodes 4a and 4b (the drain electrodes 5a and 5b) can be reduced.

As described above, by reducing the thickness of the intermediate layer on the source electrodes 4a and 4b (the drain electrodes 5a and 5b) to be smaller than the thickness of the intermediate layer on the gate insulating layer 3, the contact resistance between the source electrodes 4a and 4b (the drain electrodes 5a and 5b) and the semiconductor layers 8a and 8b can be reduced, and the carrier injection barrier can be reduced. It is thereby possible to obtain a thin-film transistor having more excellent transistor characteristics than the thin-film transistor of Embodiment 1.

As described above, with the thin-film transistor according to the present embodiment, the intermediate layers 7a' and 7b' formed on the gate insulating layer 3 reduce the surface energy on the gate insulating layer 3 that serves as a channel portion of the thin-film transistors, and cover the process residues and polar functional groups that are on the gate insulating layer 3 that can form carrier inducing sites. It is thereby possible to increase the crystallinity of the semiconductor layers 8a and 8b to improve the carrier mobility, and at the same time, the threshold voltage shift can be prevented.

Furthermore, in the present embodiment, the intermediate layer on the source electrode (the drain electrode) is formed to have a smaller thickness than the thickness of the intermediate layer on the gate insulating layer 3, or the intermediate layer is not formed on the source electrode (the drain electrode). Accordingly, the contact resistance between the semiconductor layers 8a and 8b and the source electrodes 4a and 4b (the drain electrodes 5a and 5b) can be reduced to reduce the carrier injection barrier. It is therefore possible to achieve a thin-film transistor having more excellent transistor characteristics than the thin-film transistor of Embodiment 1.

(Variation)

Figure 12:
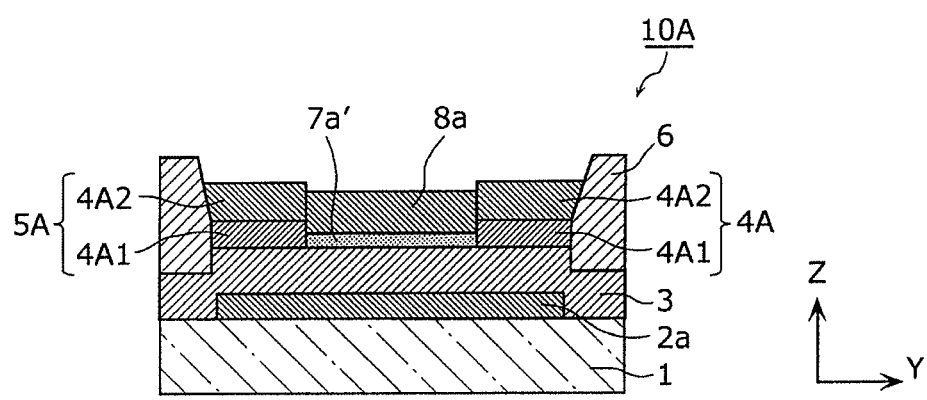
FIG. 12 is a cross-sectional view showing a configuration of a thin-film transistor according to a variation of the present invention.

Hereinafter, a thin-film transistor 10A according to a variation of the present invention will be described with reference to FIG. 12. FIG. 12 is a cross-sectional view showing a configuration of a thin-film transistor according to a variation of the present invention.

In the present variation, electron injection efficiency from a source electrode 4A and a drain electrode 5A is improved by using the intermediate layer 7a' formed on the gate insulating layer 3.

As shown in FIG. 12, each of the source electrode 4A and the drain electrode 5A of the thin-film transistor 10A according to the present variation is a two-layered structure electrode including a first electrode layer 4A1 formed on the gate insulating layer 3 and a second electrode layer 4A2 stacked above the first electrode layer 4A1.

The first electrode layer 4A1 is made of a material having a higher adhesion between the first electrode layer 4A1 and the gate insulating layer 3 than the adhesion when the second electrode layer 4A2 and the gate insulating layer 3 adhere to each other. This improves the adhesion (adhesion strength) between the first electrode layer 4A1 and the gate insulating layer 3.

The second electrode layer 4A2 is made of a material having a higher carrier injection efficiency to the semiconductor layer 8a than the first electrode layer 4A1. In other words, the height of injection barrier to the semiconductor layer 8a of the second electrode layer 4A2 is lower than the height of injection barrier to the semiconductor layer 8a of the first electrode layer 4A1.

Also, the present variation is configured such that the distance from the surface of the gate insulating layer 3 to the surface of the semiconductor layer 8a (or in other words, the total of the thickness of the intermediate layer 7a' and the thickness of the semiconductor layer 8a) is greater than the thickness of the first electrode layer 4A1.

As described above, when the source electrode 4A and the drain electrode 5A are formed by a plurality of layers, the adhesion between the source electrode 4a (the drain electrode 5a) and the gate insulating layer 3 is improved by the first electrode layer 4A1, but there is a contact region where the first electrode layer 4A1 and the semiconductor layer 8a are in contact with each other, the carrier injection efficiency decreases.

To address this, in the present variation, an intermediate layer 7a' is formed between the gate insulating layer 3 and the semiconductor layer 8a. By doing so, even when the thickness of the semiconductor layer 8a is the same as that of conventional ones, the contact region where the first electrode layer 4A1 and the semiconductor layer 8a are in contact can be reduced by an amount corresponding to the thickness of the intermediate layer 7a', and at the same time, the contact region where the second electrode layer 4A2 and the semiconductor layer 8a are in contact can be increased. As a result, the reduction of carrier injection efficiency can be suppressed by reduction of the contact region where the first electrode layer 4A1 and the semiconductor layer 8a are in contact, and at the same time, the carrier injection efficiency can be increased by increasing the contact region where the second electrode layer 4A2 and the semiconductor layer 8a are in contact. It is thereby possible to achieve a thin-film transistor having excellent transistor characteristics.

Also, in the present variation, it is preferable that the thickness of the intermediate layer 7a' is greater than the thickness of the first electrode layer 4A1. With this configuration, the contact region where the first electrode layer 4A1 and the semiconductor layer 8a are in contact does not exist, and thus the second electrode layer 4A2 is in contact with the semiconductor layer 8a from the bottom surface to the upper portion. Accordingly, the carrier injection efficiency can be further improved, and thus a thin-film transistor having more excellent transistor characteristics can be achieved.

Note that the present variation is an example of application to the first thin-film transistor 10a' of Embodiment 2, but is also applicable to the first thin-film transistor 10a of Embodiment 1. The present variation is also applicable to the second thin-film transistors 10b and 10b'.

(Others)

The thin-film transistor, the display panel and the method for producing a thin-film transistor according to the present invention have been described above by way of embodiments and a variation, but the present invention is not limited to the embodiments and the variation given above.

For example, Embodiments 1 and 2 given above have been described using, as an example, thin-film transistors for use in organic EL display panels, but the application of the present invention is not limited thereto. For example, the thin-film transistors according to the above embodiments are also applicable to other display panes such as liquid crystal display panels and field emission display panels. Furthermore, the thin-film transistors according to the above embodiments are also applicable to electronic paper and the like.

Also, in Embodiments 1 and 2 given above, a top-emission organic EL display panel is used as an example of the display apparatus, but the present invention is also applicable to a bottom emission organic EL display panel. In this case, the materials used and the layout design can be changed as appropriate.

Also, in Embodiments 1 and 2 given above, the first thin-film transistors 10a and 10a' and the second thin-film transistors 10b and 10b' are bottom contact structure thin-film transistors, but they may be top contact thin-film transistors. Furthermore, in Embodiments 1 and 2 given above, the first thin-film transistors 10a and 10a' and the second thin-film transistors 10b and 10b' are p-channel thin-film transistors, but they may be n-channel thin-film transistors.

Also, in Embodiments 1 and 2 given above, the partition material layer 6A is made of a negative photosensitive material, but it may be made of a positive photosensitive material. In this case, the transmittance and the like of the exposure mask are reversed to those of the exposure mask of the embodiments given above.

Also, in Embodiments 1 and 2 given above, the semiconductor layers 8a and 8b are formed by an application method using an application type semiconductor material, but the present invention is not limited thereto. For example, the semiconductor layers 8a and 8b may be formed by a vapor deposition method or the like using an inorganic or organic semiconductor material.

Also, in Embodiment 1 given above, the intermediate layers 7a and 7b are formed on both the source electrodes 4a and 4b and the drain electrodes 5a and 5b, but the intermediate layers 7a and 7b may be formed on either of the source electrodes 4a and 4b or the drain electrodes 5a and 5b.

The present invention also encompasses other embodiments obtained by making various types of modifications that can be conceived by those skilled in the art to the above embodiments, as well as embodiments implemented by arbitrarily combining the structural elements and functions of the above embodiments without departing from the spirit and scope of the present invention.

INDUSTRIAL APPLICABILITY

The thin-film transistor according to the present invention has a wide variety of applications including display apparatuses equipped with display panels such as organic EL display panels, and other various types of electric devices having thin-film transistors. In particular, the present invention is useful to implement high-quality thin-film transistors even in high definition display panels.

REFERENCE SIGN LIST 1, 1001 Substrate
2a, 2b, 1002 Gate electrode
3, 1003 Gate insulating layer
4a, 4b, 4A, 1004 Source electrode
4A1 First electrode layer
4A2 Second electrode layer
5a, 5b, 5A, 1005 Drain electrode
6, 1006 Partition
6a, 6b, 6c, 1006a Opening
6A Partition material layer
7a, 7a', 7b, 7b', 7c Intermediate layer
8a, 8b, 1008 Semiconductor layer
8aA, 8bA Organic semiconductor ink
9, 30 Passivation film
10a, 10a' First thin-film transistor
10b, 10b' Second thin-film transistor
10A, 1000 Thin-film transistor
20 Connection wiring 40 Planarization film
50 Organic EL element
51 Anode
52 Transparent conductive film
53 Hole injection layer
54 Hole transport layer
55 Organic light-emitting layer
56 Electron transport layer
57 Cathode
58 Bank
60 Sealing layer
70 Adhesive layer
80 CF substrate
81 Transparent substrate
82 Color filter
83 Black matrix
84 Contact hole
100 Organic EL display apparatus
110 Organic EL display panel
111 Pixel portion
112 TFT substrate
120 Driving control circuit portion
121, 122, 123, 124 Driving circuit
125 Control circuit
200 Exposure mask
211, 212, 213, 214, 221, 222, 223 Window

The invention claimed is:

1. A thin-film transistor comprising:
a gate electrode that is located above a substrate;
a gate insulating layer that faces the gate electrode;
a partition that defines an opening and has higher liquid repellency than liquid repellency of the gate insulating layer, a surface of the gate insulating layer being located in the opening;
a semiconductor layer that faces the gate electrode with the gate insulating layer interposed therebetween, and is formed within the opening by an application method;
a source electrode and a drain electrode that are electrically connected to the semiconductor layer; and
an intermediate layer that is made of the same material as a material of the partition and is located between the gate insulating layer and the semiconductor layer,
wherein the intermediate layer is discretely present above the gate insulating layer.

2. The thin-film transistor according to claim 1,
wherein the gate insulating layer on which the intermediate layer is formed has a contact angle against water that is smaller than a contact angle against water of the partition.

3. The thin-film transistor according to claim 1,
wherein the gate insulating layer on which the intermediate layer is formed has a contact angle against water of 40 degrees or more and 70 degrees or less in at least a part of a region of the intermediate layer that is in contact with the semiconductor layer.

4. The thin-film transistor according to claim 1,
wherein the intermediate layer is also located between the semiconductor layer and at least one of the source electrode and the drain electrode, and
the intermediate layer is discretely present above the at least one of the source electrode and the drain electrode.

5. The thin-film transistor according to claim 4,
wherein the intermediate layer located between the semiconductor layer and the at least one of the source electrode and the drain electrode has a smaller thickness than a thickness of the intermediate layer located between the gate insulating layer and the semiconductor layer.

6. The thin-film transistor according to claim 1,
wherein each of the source electrode and the drain electrode includes a first electrode layer that is in contact with the gate insulating layer, and a second electrode layer that is located above the first electrode layer and has a lower injection barrier to the semiconductor layer than an injection barrier to the semiconductor layer of the first electrode layer, and
a distance from a surface of the gate insulating layer to a surface of the semiconductor layer is greater than a thickness of the first electrode layer.

7. The thin-film transistor according to claim 1,
wherein each of the source electrode and the drain electrode includes a first electrode layer that is in contact with the gate insulating layer, and a second electrode layer that is located above the first electrode layer and has a lower injection barrier to the semiconductor layer than an injection barrier to the semiconductor layer of the first electrode layer, and
the intermediate layer has a greater thickness than the thickness of the first electrode layer.

8. A display panel comprising a thin-film transistor according to claim 1.

9. The display panel according to claim 8, comprising:
a plurality of the thin-film transistors formed in each of a plurality of pixels arranged in a matrix; and
a display element,
wherein one of the thin-film transistors is a driving transistor that drives the display element,
another of the thin-film transistors is a switching transistor that selectively switches driving of the display element, and
the gate insulating layer on which the intermediate layer is formed in the driving transistor has a contact angle against water greater than a contact angle against water of the gate insulating layer on which the intermediate layer is formed in the switching transistor.

10. A method for producing a thin-film transistor comprising:
forming a gate electrode above a substrate;
forming a gate insulating layer that faces the gate electrode;
forming a source electrode and a drain electrode above the gate insulating layer;
forming a partition material layer above the gate insulating layer by applying a partition material having higher liquid repellency than liquid repellency of the gate insulating layer to the gate insulating layer;
discretely forming an intermediate layer above the gate insulating layer and forming a partition having an opening by patterning the partition material layer so that at least a part of the source electrode and the drain electrode is located in the opening, the intermediate layer being made of the same material as a material of the partition material layer; and
forming a semiconductor layer above the intermediate layer within the opening by an application method.

11. The method for producing a thin-film transistor according to claim 10,
wherein in the forming of the intermediate layer, the intermediate layer is formed to allow the gate insulating layer on which the intermediate layer is formed to have a contact angle against water smaller than a contact angle against water of the partition.

12. The method for producing a thin-film transistor according to claim 10,
wherein in the forming of the intermediate layer, the intermediate layer is formed to allow the gate insulating layer on which the intermediate layer is formed to have a contact angle against water of 40 degrees or more and 70 degrees or less in at least a part of a region of the intermediate layer that is in contact with the semiconductor layer.

13. The method for producing a thin-film transistor according to claim 10,
    wherein in the forming of the intermediate layer, the intermediate layer is discretely formed above at least one of the source electrode and the drain electrode.

14. The method for producing a thin-film transistor according to claim 10,
    wherein the forming of the intermediate layer includes exposing the partition material layer to exposure light via a mask, and
    in the exposing of the partition material layer, a mask is placed that has a higher transmittance of the exposure light above the partition material layer located on the gate insulating layer than a transmittance of the exposure light above the partition material layer located on the source electrode or the drain electrode.

15. The method for producing a thin-film transistor according to claim 10,
    wherein in the forming of the intermediate layer, after the intermediate layer has been formed above the gate insulating layer and above at least one of the source electrode and the drain electrode, a thickness of the intermediate layer formed above the at least one of the source electrode and the drain electrode is reduced by irradiating the intermediate layer formed above the at least one of the source electrode and the drain electrode with laser light.

16. The method for producing a thin-film transistor according to claim 10,
    wherein in the forming of the source electrode and the drain electrode, the source electrode and the drain electrode are formed by forming a first electrode layer that is in contact with the gate insulating layer, and a second electrode layer that is located above the first electrode layer and has a lower injection barrier to the semiconductor layer than the first electrode layer, and
    in the forming of the semiconductor layer, the semiconductor layer is formed to make a distance from a surface of the gate insulating layer to a surface of the semiconductor layer greater than a thickness of the first electrode layer.

17. The method for producing a thin-film transistor according to claim 10,
    wherein in the forming of the source electrode and the drain electrode, the source electrode and the drain electrode are formed by forming a first electrode layer that is in contact with the gate insulating layer, and a second electrode layer that is located above the first electrode layer and has a lower injection barrier to the semiconductor layer than the first electrode layer, and
    in the forming of the intermediate layer, the intermediate layer is formed to make a thickness of the intermediate layer greater than a thickness of the first electrode layer.

* * * * *